(12) United States Patent
Deak

(10) Patent No.: US 7,230,844 B2
(45) Date of Patent: Jun. 12, 2007

(54) THERMOMAGNETICALLY ASSISTED SPIN-MOMENTUM-TRANSFER SWITCHING MEMORY

(75) Inventor: James G. Deak, Eden Prairie, MN (US)

(73) Assignee: NVE Corporation, Eden Prairie, MN (US)

( * ) Notice: Subject to any disclaimer, the term of this patent is extended or adjusted under 35 U.S.C. 154(b) by 9 days.

(21) Appl. No.: 11/249,046

(22) Filed: Oct. 12, 2005

(65) Prior Publication Data

US 2006/0077707 A1    Apr. 13, 2006

Related U.S. Application Data

(60) Provisional application No. 60/617,954, filed on Oct. 12, 2004.

(51) Int. Cl.
*G11C 11/14* (2006.01)
(52) U.S. Cl. ........................ 365/171; 365/173
(58) Field of Classification Search ............... 365/161
See application file for complete search history.

(56) References Cited

U.S. PATENT DOCUMENTS

| | | | |
|---|---|---|---|
| 4,771,347 A | 9/1988 | Horimai et al. | |
| 4,780,848 A | 10/1988 | Daughton et al. | |
| 4,945,397 A | 7/1990 | Schuetz | |
| 5,636,159 A | 6/1997 | Pohm | |
| 5,801,984 A * | 9/1998 | Parkin | 365/158 |
| 5,841,692 A | 11/1998 | Gallagher | |
| 5,936,293 A | 8/1999 | Parkin | |
| 6,385,082 B1 | 5/2002 | Abraham et al. | |
| 6,535,416 B1 * | 3/2003 | Daughton et al. | 365/145 |
| 6,538,919 B1 | 3/2003 | Abraham et al. | |
| 6,674,664 B2 | 1/2004 | Pohm | |
| 6,744,086 B2 | 6/2004 | Daughton et al. | |
| 6,771,534 B2 | 8/2004 | Stipe | |

(Continued)

OTHER PUBLICATIONS

J. Daughton and A. Pohm, "Design of Curie Point Written MRAM Cells". *J. Applied Physics*, 93, No. 10, p. 7304 (2003).

(Continued)

*Primary Examiner*—Tan T. Nguyen
(74) *Attorney, Agent, or Firm*—Kinney & Lange, P.A.

(57) ABSTRACT

A ferromagnetic thin-film based digital memory having a substrate supporting bit structures that are electrically interconnected with information storage and retrieval circuitry and having first and second oppositely oriented relatively fixed magnetization layers and a ferromagnetic material film in which a characteristic magnetic property is substantially maintained below an associated critical temperature above which such magnetic property is not maintained. This ferromagnetic material film is separated from the first and second fixed magnetization films by corresponding layers of a nonmagnetic materials one being electrically insulative and that one remaining being electrically conductive. Each bit structure has an interconnection structure providing electrical contact thereto at a contact surface thereof substantially parallel to the intermediate layer positioned between the first contact surface and the substrate. A plurality of word line structures located across from a corresponding one of the bit structures on an opposite side. Electrical current selectively drawn through each of these bit structures and its interconnection structure can cause substantial heating of that bit structure to raise temperatures thereof while being above temperatures of at least an adjacent said bit structure because of sufficient thermal isolation.

11 Claims, 8 Drawing Sheets

U.S. PATENT DOCUMENTS 6,777,730 B2    8/2004   Daughton et al.
6,963,098 B2 * 11/2005   Daughton et al. .......... 257/295
7,148,531 B2 * 12/2006   Daughton et al. .......... 257/295
2001/0019461 A1 9/2001   Allenspach et al.

OTHER PUBLICATIONS

R.S. Beech, J.A. Anderson, A. V. Pohm and J.M. Daughton, "Curie Point Written Magnetoresistive Memory". *J. Applied Physics*, 87, No. 9, pp. 9403-9405 (2000).

* cited by examiner

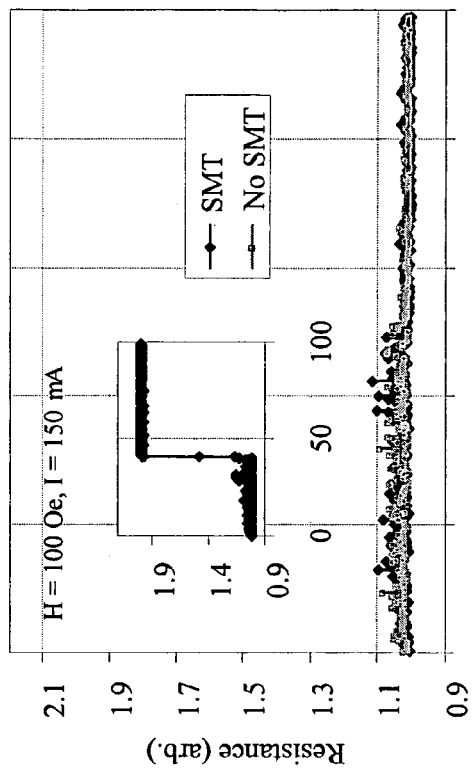
FIG. 12A
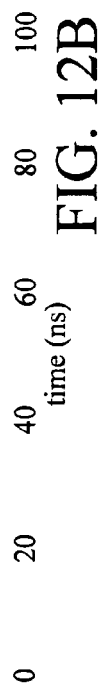
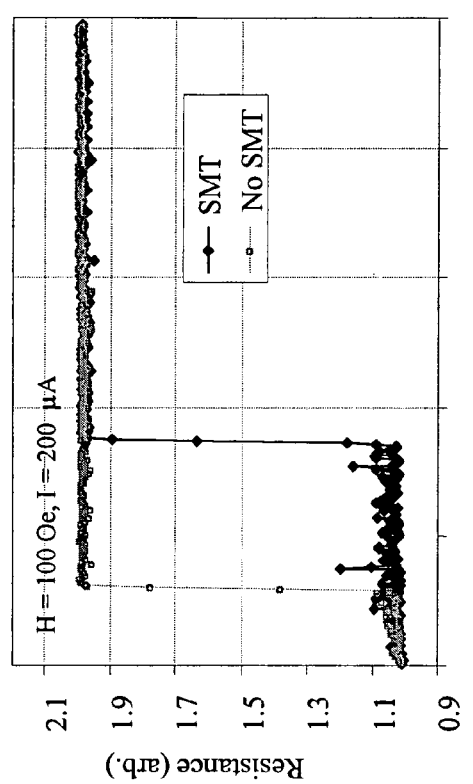
FIG. 12B
FIG. 12C
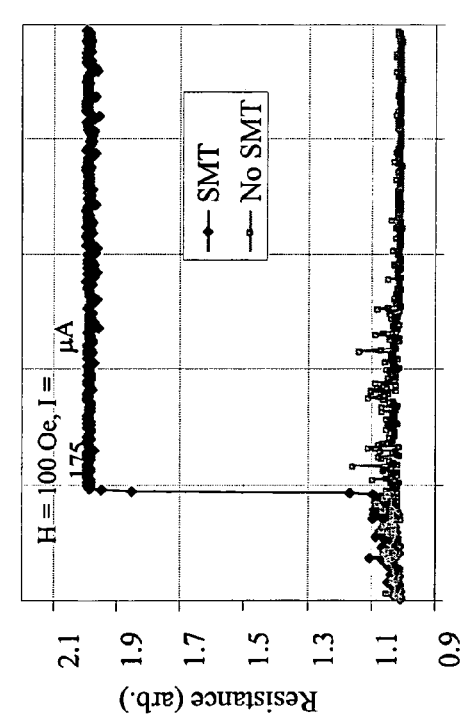
FIG. 12D

THERMOMAGNETICALLY ASSISTED SPIN-MOMENTUM-TRANSFER SWITCHING MEMORY

CROSS-REFERENCE TO RELATED APPLICATION

This application claims the benefit of provisional Patent Application No. 60/617,954 filed Oct. 12, 2004 for "THERMALLY ASSISTED SPIN INJECTION SWITCHING MEMORY".

BACKGROUND OF THE INVENTION

The present invention relates to ferromagnetic thin-film structures exhibiting relatively large response magnetoresistive characteristics and, more particularly, to such structures used for the storage and retrieval of digital data.

Many kinds of electronic systems make use of magnetic devices including both digital systems, such as memories, and analog systems such as magnetic field sensors. Digital data memories are used extensively in digital systems of many kinds including computers and computer systems components, and digital signal processing systems. Such memories can be advantageously based on the storage of digital symbols as alternative states of magnetization in magnetic materials provided in each memory storage cell, the result being memories which use less electrical power and do not lose information upon removals of such electrical power.

Such memory cells, and magnetic field sensors also, can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

Ferromagnetic thin-film memory cells, for instance, can be made very small and packed very closely together to achieve a significant density of information storage, particularly when so provided on the surface of a monolithic integrated circuit. In this situation, the magnetic environment can become quite complex with fields in any one memory cell affecting the film portions in neighboring memory cells. Also, small ferromagnetic film portions in a memory cell can lead to substantial demagnetization fields which can cause instabilities in the magnetization state desired in such a cell.

These magnetic effects between neighbors in an array of closely packed ferromagnetic thin-film memory cells can be ameliorated to a considerable extent by providing a memory cell based on an intermediate separating material having two major surfaces on each of which an anisotropic ferromagnetic memory thin-film is provided. Such an arrangement provides significant "flux closure," i.e. a more closely confined magnetic flux path, to thereby confine the magnetic field arising in the cell to affecting primarily just that cell. This result is considerably enhanced by choosing the separating material in the ferromagnetic thin-film memory cells to each be sufficiently thin. Similar "sandwich" structures are also used in magnetic sensors.

In the recent past, reducing the thicknesses of the ferromagnetic thin-films and the intermediate layers in extended "sandwich" structures, and adding possibly alternating ones of such films and layers, i.e. superlattices, have been shown to lead to a "giant magnetoresistive effect" being present in some circumstances. This effect yields a magnetoresistive response which can be in the range of up to an order of magnitude or more greater than that due to the well known anisotropic magnetoresistive response.

A memory cell based on the "giant magnetoresistive effect" can be provided by having one of the ferromagnetic layers in the "sandwich" construction being prevented from switching the magnetization direction therein from pointing along the easy axis therein in one to the opposite direction in the presence of suitable externally applied magnetic fields while permitting the remaining ferromagnetic layer to be free to do so in the same externally applied fields. In one such arrangement, a "spin-valve" structure is formed by providing an antiferromagnetic layer on the ferromagnetic layer that is to be prevented from switching in the externally applied fields to "pin" its magnetization direction in a selected direction. In an alternative arrangement often termed a "pseudo-spin valve" structure, the ferromagnetic layer that is to be prevented from switching in the externally applied fields is made sufficiently thicker than the free ferromagnetic layer so that it does not switch in those external fields provided to switch the free layer.

An alternative digital data bit storage and retrieval memory cell suited for fabrication with submicron dimensions can be fabricated that provides rapid retrievals of bit data stored therein and low power dissipation by substituting an electrical insulator for a conductor in the nonmagnetic layer. This memory cell can be fabricated using ferromagnetic thin-film materials of similar or different kinds in each of the magnetic memory films used in a "sandwich" structure on either side of an intermediate nonmagnetic layer which ferromagnetic films maybe composite films, but this intermediate nonmagnetic layer conducts electrical current therethrough based primarily on a quantum electrodynamic effect "tunneling" current, or spin dependent tunneling.

Operating magnetic fields imposed externally can be used to vary the angle of the magnetization vector with respect to the easy axis in the ferromagnetic films of these various kinds of memory cell devices, particularly the free layers. Such operational magnetic fields imposed externally can be used to vary the angle to such an extent as to cause switching of the layer magnetization vector between two stable states which occur for the magnetization being oriented in opposite directions along the easy axis of the layer, the state of the cell determining the value of the binary bit being stored therein. One of the difficulties in such memories is the need to provide memory cells therein that have extremely uniform switching thresholds and adequate resistance to unavoidable interjected magnetic field disturbances in the typical memory cell state selection scheme used. This externally applied operating fields scheme is based on selective externally imposed magnetic fields provided by selectively directing electrical currents over or through sequences of such cells so that selection of a cell occurs through coincident presences of such fields at that cell. Such a coincident interjected magnetic fields memory cell state selection scheme is very desirable in that an individual switch, such as that provided by a transistor, is not needed for every memory cell, but the limitations this selection mode imposes on the uniformity of switching thresholds for each memory cell in a memory make the production of high yields difficult.

Such memory cells, whether based on being operated by coincidently provided magnetic fields only or operated with supplemental switching transistors, can be modified to use Curie point or Néel point data storage, or writing, techniques based on the thermal pulse accompanying a current pulse provided in or near the cell. If such storing currents are established that are sufficient to heat these storage layers to the Curie temperature thereof, then much less magnetic field strength would be needed to change the magnetic states of the storage layers and the values of the storing currents could be much reduced to effectively avoid significant magnetization rotation thresholds in the device magnetic material layers.

Another alternative for "sandwich" structure magnetoresistive memory cells is to switch between the magnetic states of such memory cells operated by switching transistors to control the supplying of spin polarized electrical currents thereto to reverse the magnetization direction of a soft magnetic material layer therein in the absence of any externally applied magnetic field coincident therewith. A spin polarized electrical current has therein electrons flowing with their spins aligned in one direction predominating the number of electrons therein with spins in the opposite direction. Such spin injection currents with the spins of electrons therein predominating in one direction or the other lead to a corresponding spin injection torque on the device magnetic material layer magnetization sufficient to reverse the direction thereof as a device magnetic state change.

With or without the use of such thermal pulse techniques or the use of spin polarized electrical currents, however, as the dimensions of magnetoresistive elements in memory cells shrink in size to be on the order of a few nanometers, the problems that must be overcome become more difficult in order to make successful operating magnetoresistive memories having long data retention times and low error rates. These problems include (a) the increasing thermal instability of those cells therein intended not to have the magnetic states thereof switched in current operations because less thermal energy is needed to upset the magnetic states of smaller memory cells, (b) the needing of larger electrical current densities to overcome the greater demagnetization fields of smaller cells in operations to store information therein through switching between the magnetic states thereof which risk damage to the device or become impractical to generate in the device, and (c) the greater stray field interactions between adjacent memory cells on a common substrate.

A small magnetic material memory element with uniaxial anisotropy generally tends to preferentially align its magnetization with the uniaxial anisotropy axis in the absence of an externally applied magnetic field. As a function of the angle between the direction of the magnetization, and the direction of the easy-axis, the energy of the small element may be described as $E=K_{eff} \sin^2$ where $K_{eff}$ is a constant related to the properties of the element ferromagnetic material and to the shape of the element, and t is the angle between the easy-axis and the direction of the magnetization in the element as shown for an elliptically shaped element in FIG. 1. The magnetization direction of the element can be reversed by applying an external magnetic field $H_a=2Keff/M_s$. The energy barrier needed to be overcome to reverse the magnetization of the element is related to the volume of the element by $\Delta E=K_{eff} V$. Note that application of a magnetic field less than $H_c$ lowers the energy barrier by an amount $0.5*(2K_{eff}/M_s-H_a)V$ if switching into the direction of the applied field. This reduction of the energy barrier in the direction of the applied field is useful for reducing the current required to reverse the free layer of a memory device using the spin-momentum transfer effect. At nonzero temperature, there is a finite probability that the magnetization of the element will spontaneously reverse. In a finite time interval $\Delta t$, the probability an element will reverse due to thermal activation is $P(\Delta t, T, \Delta E)=P_0 e^{-\Delta t/\tau}$ where an Arrhenius law relates the relaxation time constant to the energy barrier and temperature, $$\tau = \frac{1}{f_0} e^{\Delta E/k_B T}.$$

Here $f_0$ is an attempt frequency of ~$10^9$ Hz that is often considered a constant, and $\tau$ is a relaxation time. The energy barrier defining the thermal stability or data retention time of the element is labeled $\Delta E$ in FIG. 1, and it represents the amount of energy needed to be applied in the absence of thermal fluctuations (at absolute zero) to the ferromagnetic material element to reorient the magnetization from 0° to 180° or from 180° to 0°.

The expected probability to switch in a finite time period is illustrated in FIG. 2. The ratio $\Delta E/k_B T=S$ is often called the stability factor, and it relates the zero temperature energy barrier to the thermal energy of the system. It is clear that $S \gtrsim \ln(f_0 \tau)$ in order for the memory element to retain data for a time period of $\tau$. For $\tau=10$ years, this value is $S=40$ as shown in FIG. 2. Because the energy barrier is proportional to the volume of the element, maintaining a large stability factor with a small fixed volume requires an increase in $K_{eff}$.

However, increasing $K_{eff}$ also increases the externally applied magnetic fields needed to be used for selecting the desired magnetic state in the memory element to represent current data therein, and so also the associated electrical currents by which the memory element is operated through generating such external fields, to impractical levels as indicated in FIG. 3. This figure shows, for an elliptically shaped, ferromagnetic material memory element with an arbitrarily selected size of 75 nm by 50 nm to thereby be a single domain element, the switching energy or stability factor versus the element layer thickness (and so effectively versus volume) and the resulting magnetic coercivity of that layer versus that thickness. A horizontal line in the figure at a switching energy value of 40 intersects the plot of the $K_{eff}$ V stability curve at a memory element layer thickness of about 2.5 nm which is shown by a vertical arrow to the plot of the coercivity curve and a subsequent horizontal arrow to result in a coercivity of about 200 Oe. Thus, an externally applied magnetic field on the order of this value is required to accomplish reversing the magnetization direction in the element. This shows the difficulty in using only an externally applied magnetic field to provide such switching as generating a field in excess of 100 Oe is difficult in monolithic integrated circuit based magnetoresistive memory devices. Thus, there is a desire for alternative, or supplemental methods, for storing information in magnetoresistance based memory cells.

BRIEF SUMMARY OF THE INVENTION

The present invention provides a ferromagnetic thin-film based digital memory having a substrate supporting bit structures separated from one another by spacer material that are electrically interconnected with information storage and retrieval circuitry and having first and second relatively fixed magnetization layers each with a magnetization direction substantially opposite one another and a ferromagnetic material film in which a characteristic magnetic property is substantially maintained below an associated critical temperature above which such magnetic property is not maintained. This ferromagnetic material film is separated from the first fixed magnetization film by a first intermediate layer of a nonmagnetic material having first and second major surfaces and further being separated from the second fixed magnetization film by a second intermediate layer of a nonmagnetic material having first and second major surfaces with the nonmagnetic material of one of the first and second intermediate layers being electrically insulative and that one remaining being electrically conductive. These bit structures each have an interconnection structure providing electrical contact thereto positioned against a contact surface thereof substantially parallel to the intermediate layer major surfaces and also being between the contact surface and the substrate. There is also a plurality of word line structures each located across from a corresponding one of the bit structures on an opposite side of the intermediate layer of a corresponding one of said bit structures from the first interconnection structure providing electrical contact thereto. The information storage and retrieval circuitry can draw electrical current selectively through each of these bit structures and its interconnection structure providing electrical contact thereto to cause heating of that bit structure to raise temperatures thereof to have the ferromagnetic material film therein while being above temperatures of at least an adjacent said bit structure because of sufficient extent of, and smallness of thermal conductivities of, at least portions of the selected bit structure and of those portions of the substrate and the spacer material positioned thereabout.

Low thermal diffusivity material can be used to couple the magnetic material films to the interconnection structure, and such a layer can also be provided on an opposite side of the intermediate layer to couple the magnetic material films to another interconnection structure or to the corresponding word line. In the latter arrangement, magnetic material cladding of the word line can be extended to magnetically shield the bit structure formed in conjunction with the intermediate layer therein.

BRIEF DESCRIPTION OF THE DRAWINGS

FIG. 12 shows a graphs with plots related to the simulation results for the structure of FIG. 4.

DETAILED DESCRIPTION

The electrical current needed for generating a resulting externally applied magnetic field to switch the magnetization direction in the free layer of a magnetoresistive memory device to a reverse position along the layer uniaxial anisotropy axis, or easy axis, can be too large to be practical as described above. This current magnitude can be reduced by supplementing the application of such switching current through additionally providing spin momentum transfer electrical currents in the device and resistive heating electrical currents in or adjacent to the device.

Figure 4:
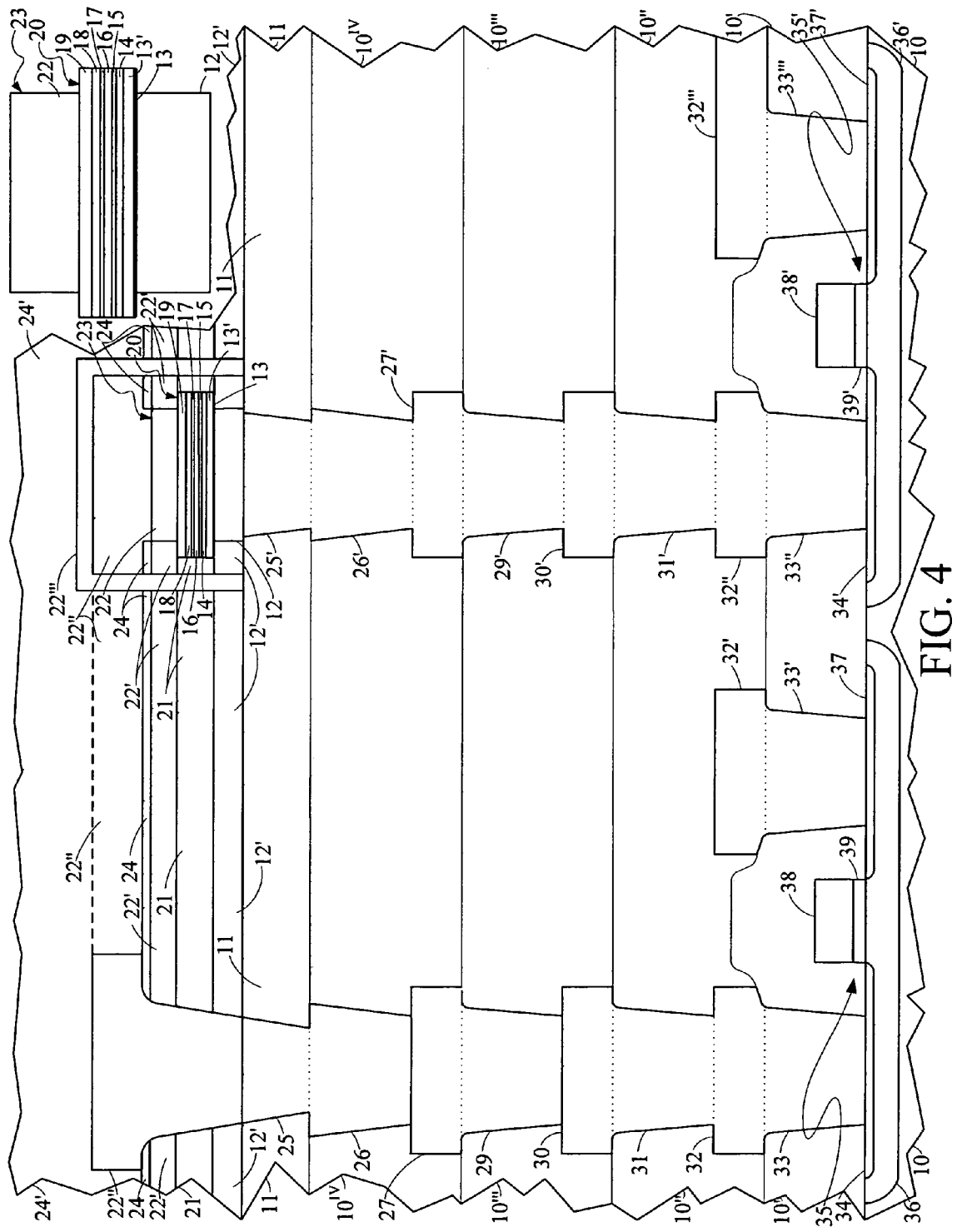
FIG. 4 shows a layer diagram of a cell structure and interconnection arrangement in a monolithic integrated circuit cell control configuration.

A monolithic integrated circuit structure example of such a magnetoresistive memory device arrangement suitable for this kind of operation is shown in a fragmentary view thereof in FIG. 4. There is shown a monolithic integrated circuit chip layer diagram of an external supplemented magnetic field switched memory element or cell magnetoresistive structure that is assisted in operation by supplemental spin momentum transfer and resistive heating electrical currents. The cell is shown along with transistor current controllers to be used therewith. This layer diagram gives indications of the structural layers leading to the cell structural portions shown in FIG. 4, but it does not provide a true cross section views in that many dimensions there are exaggerated or reduced relative to one another for purposes of clarity.

The memory cell structure shown in FIG. 4 is configured with a word line for carrying electrical current to provide an externally applied electrical field for selecting the desired magnetic state of the cell in the storage of data therein. This word line also carries spin momentum transfer and thermal assist cell magnetic state setting currents for aiding the field current in selecting the desired magnetic state of the cell, as well as a cell state sense current for retrieving the data stored therein, through the word line being in direct contact with the cell structure.

In such a configuration, the cell structure during data storage will be heated by passing electrical current through the word line conductor, the memory cell including its effectively resistive tunneling barrier, and through the selection transistor connected thereto as well as acquiring a spin momentum transfer assist from such a current. Fortunately, the magnitude of the electrical current required for effective resistive heating in the cell structure is similar to that required for spin momentum transfer current based free layer magnetization direction reversal. Then, before the cell structure cools from such heating, the cell selection transistor is switched off, and electrical current is then passed through the word line but not the cell for the purpose of maintaining the externally applied magnetic field to aid in setting a cell magnetization state as the cell structure cools aid to complete the storing data therein. The selection transistor insures that only one cell in the array is heated so that only that cell under the word line conductor has data stored therein.

As can be seen in FIG. 4, the memory cell structure is provided on a semiconductor material monolithic integrated circuit chip serving as a substrate therefor and having electronic circuit component devices provided in the semiconductor material, 10, thereof as the substrate for the remaining portions of the integrated circuit itself. Those remaining portions of the monolithic integrated circuit shown in FIG. 4 above the semiconductor material 10 are a series of four electrical insulating layers, 10', 10", 10''', 10$^{iv}$, each typically formed of silicon dioxide. Each of the lower three of these electrical insulating layers have a metal circuit interconnection pattern supported thereon for electrically interconnecting selected ones of the circuit component devices therebelow in semiconductor material 10 and the integrated "sandwiches" structure thermally and field assisted spin momentum transfer switched devices provided thereabove.

Following chemical and mechanical polishing of the surface of last or uppermost electrical insulating layer 10$^{iv}$, and the opening of vias therein to provide metal interconnections to the interconnection layer therebelow, a further electrical insulating layer, 11, is formed on the resulting surface by sputter deposition of silicon nitride to a thickness of typically 1000 Å. The surface of layer 11 is then also chemically and mechanically polished to provide a resulting surface on which the integrated "sandwiches" tunneling or spin valve devices are to be provided.

These integrated "sandwiches" structure devices are next provided by a series of layer depositions beginning on this prepared surface with portions of these deposited layers being later removed by ion milling to leave the desired device portions remaining on the upper surface of layer 11, and on the surfaces of appropriate exposed interconnections intersecting the upper surface of layer 11. The results thereof are represented in the spin dependent memory cell magnetic structure shown in FIG. 4, and in the corresponding inset in that figure which is enlarged over that version shown in the main portion of the figure for clarity. The remaining portions will be designated with the same numerical designation as are used in describing the deposition layers from which each is formed.

Thus, a first thermal resistance control via layer, 12, is deposited on the exposed surface of an electrical interconnection extending through layer 11 from the integrated circuitry in the substrate below. Layer 12 is formed of an alloy providing a relatively small thermal conductivity despite its being an electrical conductor with a value on the order of 0.01 W/cm-K. Such a layer comprises CrPtMnB in proportions of 40% chromium, 10% platinum, 40% manganese and 10% boron that is sputter deposited on the exposed interconnection and layer 11 to a thickness of 200 Å to 5000 Å, depending on the thermal resistance desired, and is typically 600 Å thick. This thermal via structure is typically provided as a truncated cylinder with a 600 Å radius which gives it a cross sectional area that is smaller than that of the magnetic material structures to be subsequently provided thereon. Thereby, this thermal via structure has a corresponding increased thermal resistance to aid those magnetic material structures to reach the elevated temperatures desired therefor in switching their magnetization directions during data storage therein. Such a shape is provided by ion milling the deposited layer.

A layer of encapsulating organic material, 12', is then spun on the structure as fabricated to this point to cover the thermal vias and cured by heating. This layer is chosen to have a very low thermal conductivity such as on the order of 0.002 W/cm-K to aid in confining the heat developed during data storage operations in the magnetic material structures to be subsequently provided in those structures. A typical material is a polyamide or, alternatively, a photoresist. The cured material is then is then lapped back using chemical and mechanical polishing to expose the outer surfaces of thermal vias 12.

An antiferromagnetic material layer is next provided, and can be provided in the presence of a magnetization axis determination magnetic field pointing to the right or left in the plane of the figure to thereby parallel the lengths of the completed devices although this is often omitted by instead establishing magnetization directions upon completion of the device. This antiferromagnetic material layer, through exchange coupling, will maintain the direction of magnetization of the ferromagnetic material in the layer thereof that will be subsequently provided supported on this antiferromagnetic material layer. First, a buffer layer, 13, of tantalum 10 Å thick is sputter deposited on thermal vias 12 and on encapsulating organic material 12' as a base to which the antiferromagnetic material layer will adhere. This antiferromagnetic material layer, 13', is then provided by sputter depositing around 100 Å of an alloy of PtMn comprising 50% platinum and 50% manganese.

The provision of the thermal resistance and antiferromagnetic pinning layers 12 and 13' is followed by providing a ferromagnetic thin-film, 14. This ferromagnetic thin-film layer is provided to have a net layer magnetization that, when fixed in a selected spatial orientation in the finally formed structure, will resist magnetization rotation, and certainly resist any magnetization rotation therein that could be sufficient to lead to a reversal in its orientation as a result of those magnetic fields expected to be externally applied in operating the device. Thus, for the finally formed cell structures intended to be used in limited magnetic fields, the magnetization of this thin-film layer will appear fixed in its orientation in the device pointed either to the right or the left in the plane of the figure along the layer easy axis, i.e. "pinned" in a direction relative to the finally formed cell structure which will be in the layer plane of FIG. 4. This thin-film layer is formed by sputter depositing ferromagnetic material thin-film layer 14 formed of CoFe comprising 95% cobalt and 5% iron to a thickness of 40 Å. This layer can be deposited in the presence of an easy axis direction determination magnetic field oriented as was such a field, if any, chosen to be provided during deposition of antiferromagnetic material layer 13' to thereby form a layer easy axis in this direction in the plane of the figure or, more typically, depositing same without such a field because of establishing layer magnetization directions at completion of the fabrication of the device. The resulting compound layer 14 is formed of a material with high spin polarization in being of high magnetic induction CoFe. Antiferromagnetic material "pinning" layer 13', exhibiting a substantial magnetic anisotropy, is present to strongly set the magnetization direction of layer 14 in the direction of the easy axis in the plane of the figure. Such a layer has a strongly fixed magnetization direction as result of exchange coupling to layer 13'. However, if layer 14 were deposited to a sufficient thickness to thereby have a sufficiently large coercivity, layer 13' need not be used.

Next in the memory cell magnetic structure of FIG. 4, a spin dependent tunneling layer or barrier layer, 15, as a first intermediate layer, is provided by sputter deposition onto layer 14, this barrier layer being a dielectric. Layer 15 is provided typically by sputter depositing 12 Å of aluminum onto layer 14, and continuing to provide two further angstroms of this material using the aluminum sputtering target but also introducing oxygen into the sputtering chamber. The result is to convert the already deposited aluminum layer substantially into aluminum oxide which expands its thickness by a factor of about 1.3, and to add another two angstroms of aluminum oxide thereto giving a barrier layer thickness of approximately 17.5 Å with this resulting layer being formed primarily of aluminum oxide. Alternatively, such a barrier layer can be formed of magnesium oxide (or the layer can be provided as a sufficiently thin layer of copper if a GMR device is chosen to be formed rather than a spin dependent tunneling device).

Then, a ferromagnetic material thin-film layer, 16, is deposited on the exposed surface of layer 15 as a magnetic "free layer" that can have its magnetization direction relatively easily altered during operation of the completed device by externally applied magnetic fields. Layer 12 can be formed of an alloy comprising 80% nickel and 20% iron but can also be formed with some cobalt added to increase the saturation induction thereof. In addition, some nonmagnetic material constituents can be added to further alter the magnetic and magnetoresistive characteristics thereof such as boron, copper, molybdenum or silicon.

A second intermediate layer, 17, is furnished as a conductive layer to allow spin-polarized transport with low magnetoresistance. As will be described below, low magnetoresistance in layer 17 is necessary in order to produce a memory device with resistance measured between layers 12 and 22 indicative of the orientation of the magnetization of the free layer, 16. Conductive layer 17 is provided by sputter deposition of copper onto free layer 16 to a thickness of around 30 Å.

Similar to layer 14, a further ferromagnetic material layer, 18, is next provided as was that layer for forming the second antiferromagnet in the device through sputter deposition of typically the same material composition to a thickness of 30 Å. This deposition occurs in the presence of an easy axis direction determination magnetic field oriented along, or oppositely to, the field provided during deposition of layer 14 to thereby form a layer easy axis extending right and left in the plane of FIG. 4. This layer enhances spin polarization transport to free layer 16 and needs to have its magnetization pinned in a direction opposite to that of layer 14 at some point in the fabrication process. The second antiferromagnet is completed by providing a antiferromagnetic material "pinning" layer, 19, similar to antiferromagnetic material "pinning" layer 13' but through sputter depositing a similar material of a different composition, or an altogether different material, to a thickness around 100 Å. The difference in the material used for layer 19 from that used for layer 13' is needed because these two layers need to have different blocking temperatures so that the magnetization directions of antiferromagnetic material "pinning" layers 13' and 19 can be established in opposite directions, or right versus left in the plane of FIG. 4, and so also those of ferromagnetic "pinned" layers 14 and 18. This assumes, as is usual, such establishing is chosen to be provided upon completion of the fabrication of the device rather than at the steps of providing the layers involved. This establishing of magnetization directions upon completion of the device fabrication is accomplished by heating the device at some point in the subsequent portion of the device fabrication process beyond both blocking temperatures in the presence of an easy axis direction determination magnetic field oriented either to the right or the left along the plane of FIG. 4, and then, after cooling, again heating the device beyond the lower blocking temperature, but not the higher, in the presence of an easy axis direction determination magnetic field oriented in the opposite direction along the plane of that figure. Of course, if antiferromagnetic "pinning" layers 13' and 19 are omitted because of using sufficient thicknesses of ferromagnetic material layers 14 and 18 to provide them with sufficient coercivities to pin their magnetizations in opposite directions along the plane of FIG. 4 after their easy axes being established in those directions, performing such establishments by aid of heating will require that the materials of these two layers be sufficiently different to give them significantly different Curie temperatures.

Upon completion of the second antiferromagnet formed by antiferromagnetic material "pinning" layer 19 and ferromagnetic material layer 18 provided on the second intermediate layer provided by copper conductive layer 17 (assuming antiferromagnetic material "pinning" layer 19 is used), a further layer is deposited on layer 19 to provide an etching termination layer, or stop, for subsequent etching steps. A milling mask layer is next sputter deposited on the etch stop layer to there be prepared for use as a milling mask by being suitably patterned using standard techniques. The subsequent ion milling step removes the exposed portions of antiferromagnetic material "pinning" layer 19 along with ferromagnetic material "pinned" layer 18 in the second antiferromagnet, second intermediate conductive layer 17, ferromagnetic "free" layer 16, insulative barrier layer 15, and the first antiferromagnet formed by ferromagnetic material "pinned" layer 14, and antiferromagnetic material "pinning" 13' to thereby form an internal cell structure, 20, for the supplemented external magnetic field switched memory cell magnetoresistive structure of FIG. 4 that is supplemented in operation by spin momentum transfer and resistive heating electrical currents.

As a result of this ion milling, internal cell structure 20 is formed with a length dimension right and left in the plane of FIG. 4 of 1300 Å. The width thereof in and out of the plane of the figure is 900 Å.

A further layer of encapsulating organic material, 21, is then spun on the structure as fabricated to this point to cover internal structures 20 along with the exposed portions of encapsulating layer 12' and cured by heating. This layer is chosen again to have a very low thermal conductivity such as on the order of 0.002 W/cm-K to aid in confining the heat developed during data storage operations in structures 20. Here, too, a typical material is a polyamide or, alternatively, a photoresist. The cured material is then is then lapped back using chemical and mechanical polishing to expose the outer surfaces of structures 20.

A second thermal resistance control via layer, 22, is deposited on the exposed surface of structures 20. Layer 22 is again formed of an alloy providing a relatively small thermal conductivity despite its being an electrical conductor with a value on the order of 0.01 W/cm-K. Such a layer here too comprises CrPtMnB in proportions of 40% chromium, 10% platinum, 40% manganese and 10% boron that is sputter deposited on the exposed interconnection and layer 11 to a thickness of 200 Å to 5000 Å, depending on the thermal resistance desired, and is typically 600 Å thick. This thermal via structure is also typically provided as a truncated cylinder with a 600 Å radius which gives it a cross sectional area that is smaller than that of internal structure 20 on which it is supported. Thereby, this thermal via structure has a corresponding increased thermal resistance to aid those magnetic material structures to reach the elevated temperatures desired therefor in switching their magnetization directions during data storage therein. Such a shape is again provided by ion milling the deposited layer.

Another layer of encapsulating organic material, 22', is then spun on the structure as fabricated to this point to cover thermal vias 22 and cured by heating. This layer is again chosen to have a very low thermal conductivity such as on the order of 0.002 W/cm-K to aid in confining the heat developed during data storage operations in structures 20. As before, a typical material is a polyamide or, alternatively, a photoresist. The cured material is then is then lapped back using chemical and mechanical polishing to expose the outer surfaces of thermal vias 22 which will have aluminum interconnections, 22", made thereto with a cladding, 22''', formed about the interconnection at the cell location.

Following the completion of thermal vias 12, cell internal structures 20 and thermal vias 22 in FIG. 4 to form a complete memory cell, 23, a layer of silicon nitride is sputter deposited over those thermal vias 22 and the exposed portions of encapsulating material layer 22' to a thickness of 200 Å to form another insulating layer. Photoresist is provided and patterned over this insulating layer as an etching mask to provide via openings therethrough in a following etching step to form a completed insulating layer, 24, exposing thermal vias 22, and then further photoresist masking followed by etching through the then exposed portions of encapsulating material layers 12', 21 and 22', and further through silicon nitride layer 11 to reach appropriate metal interconnection risers extending through other insulating layers in the monolithic integrated circuit therebelow. Alternatively, insulating layer 24 could be formed of an even lower thermal conductivity electrically insulating material to further reduce heat flows from memory cell internal structures 20 therethrough. Such alternative insulating materials can be organic materials such as polyimide or B-staged bisbenzocyclobutene (BCB) which have thermal conductivities below those of commonly used electrical insulating materials in monolithic integrated circuits such as silicon dioxide or silicon nitride.

On insulating layer 24, so prepared, a further metal deposition is made again of aluminum, but alloyed with 2% copper, to cover that layer and fill the via openings therein, and in silicon nitride layer 11. This metal layer is deposited to a thickness of 2000 Å typically and patterned in a standard manner to eliminate the unwanted metal layer portions. The structures that result from this elimination are shown in FIG. 4 as a plurality of interconnections 22" for interconnecting memory cell structures 23 to the electronic circuitry in the integrated circuit therebelow through mating with metal interconnection risers extending through insulating layers of that integrated circuit.

Interconnections 22" serve as word lines involved in selecting which of memory cells 23 is to undergo a storage or retrieval operation, and so carries the cell state sense current in such retrieval operations and also the thermally, and spin momentum transfer, assisted cell magnetic state setting current in such storage operations through their being in direct contact with those cell structures 23. In such a configuration, as indicated above, cell internal structure 20 will be heated by passing electrical current through the word line conductor and through the selection transistor connected thereto. Then, before that cell structure cools, a transistor at the end of the word line conductor is switched on, and current is passed through the word line to provide a magnetic field and spin momentum for the purpose of storing data by setting a cell magnetization state as the cell structure cools. The selection transistor insures that only one cell in the array is heated so that only that cell under the word line conductor has data stored therein.

This further allows for the word line cladding to be provided at each cell structure that extends downward to be about corresponding sides of the associated cell internal structure 20. Thereby, fringing of the magnetic fields generated by electrical currents established in the adjacent word line will be reduced, and so reduce the electrical current in word line 22" needed to achieve a magnetic field therefrom of a selected intensity.

Thus, in FIG. 4, word line 22''' at, and interconnected to, the top of cell 23 is shown in solid line form where in electrical and physical contact with that cell and having an extension thereof rearward and then to the left being shown in dashed line form. Downward extended cladding 22''' is seen to provide a much more closely defined magnetic path about the memory cell structure. A silicon nitride insulating layer, 24', protects cladded word lines 22" in FIG. 4.

If the cladding material is an electrical insulator and a poor thermal conductor, then no insulating spacing between the cladding and the cell would be needed. In the more usual situation in which the cladding material is either a good electrical or thermal conducting ferromagnetic material, or both, an insulating spacing layer would be required. The fabrication process can be accomplished in a similar manner to the spacer dot process used in integrated circuit production. First form the cell structure layers stack with the thermal vias. Then coat the stack with an insulator, polish the insulator back to allow electrical and physical contact to the stack, and form the word line with cladding on top. The word line must be oversized with respect to the cell structure to allow for insulation from the cladded edge of the word line to the edge of the stack. Then etch down vertically using the word line as a mask. The cladding on top may have to be thick to allow for etching of the cladding at this step. Then deposit cladding material uniformly on the substrate. Then etch down vertically to remove the newly deposited cladding material except near the edges of the stack.

A sputter deposition of silicon nitride is then to form protective layer 24' over cladded interconnections 22". Thereafter, the procedure indicated above to establish the easy axes directions with opposing layer magnetization directions in ferromagnetic material layers 14 and 18 (and with corresponding magnetizations in antiferromagnetic layers 13' and 19) can be performed.

Figure 5A:
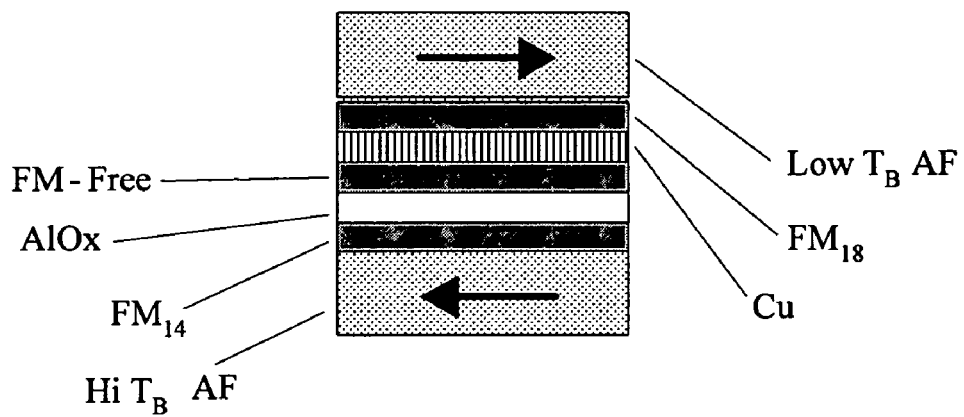
FIG. 5 shows schematic layer diagrams of alternative cell structure arrangements.
Figure 5B:
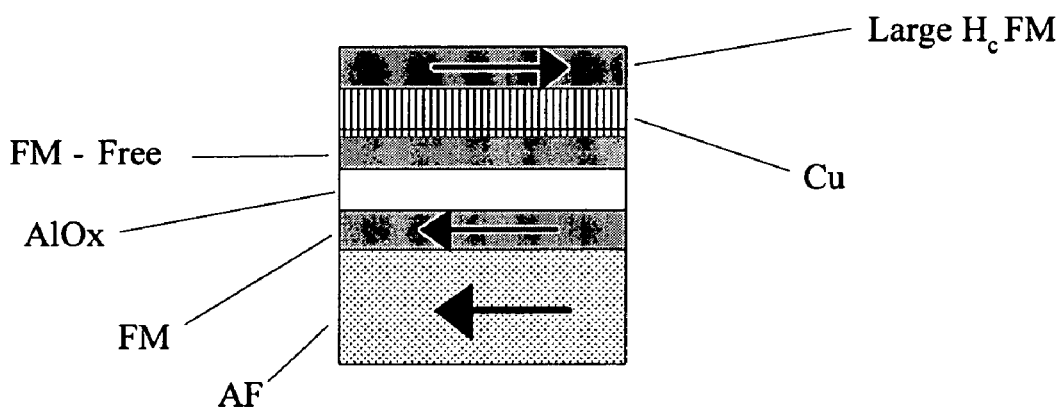

Arrangements for providing pinned ferromagnetic material layers other than the foregoing are also possible, and some of them are indicated in the schematic representations thereof in FIG. 5 in addition to representing the above described arrangement in FIG. 5A. That is, FIG. 5A represents schematically the arrangement for using high and low temperature magnetic annealing steps to establish the "pinned" magnetization directions for upper ferromagnetic material layer 18 ($FM_{18}$) and lower ferromagnetic material layer 14 ($FM_{14}$) in opposite directions. In the arrangement of FIG. 5B, the "pinned" magnetization direction upper ferromagnetic material layer (Large $H_c$ FM) has a larger coercivity than the FM-Free layer, and the "pinned" magnetization direction lower ferromagnetic material layer (FM) has its magnetization direction maintained through use of an antiferromagnetic layer (AF) in an exchanged coupling relationship. Upper layer Large $H_c$ FM has its magnetization direction established opposite to the direction previously established for lower layer FM by applying a large field at room temperature. The combination of stray field coupling between these "pinned" upper and lower layers, and the low externally applied magnetic fields used to orient the magnetization direction of the free layer, allow the "pinned" upper layer to remain in the orientation established therefor.

Figure 5C:
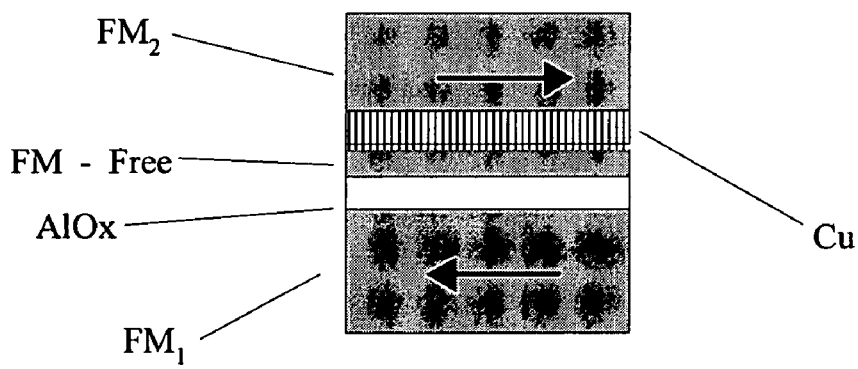

In FIG. 5C, "pinned" lower ferromagnetic material layer $FM_1$ is slightly thicker than "pinned" upper ferromagnetic material layer $FM_2$, and they are each much thicker than the FM-Free layer. All can be forced to have their magnetization directions in a common direction along the length of the device through the application of a large magnetic field at room temperature. Removal thereafter of the large magnetic field and the stray field magnetostatic coupling will align the magnetization direction of "pinned" upper layer $FM_2$ in a direction along the length of the device opposite the direction of magnetization of "pinned" lower layer $FM_1$.

Although synthetic antiferromagnet (SAF) pinned layers composed of antiferromagnetically coupled ferromagnetic layers, such as CoFe/Ru/CoFe, are often used as the "pinned" layer structure in being exchanged coupled to an adjacent antiferromagnetic layer, this is not a desirable arrangement for the present invention. The spin diffusion length in most ferromagnetic materials is longer than the 2 to 10 nm thickness that would be used in such a SAF "pinned" layer structure so that the direction of the magnetization in an SAF "pinned" layer structure changes over shorter distances than the spin diffusion length. As a result, a SAF "pinned" layer structure will scatter some of the electron spins leading to a reduced spin polarization in the heating current.

Interconnection 22" extending from memory cell 23 in FIG. 4 through insulating layer 24, and through encapsulating material layers 12', 21 and 22', meets an electrical interconnection riser on the left in those figures by having a portion thereof, 25, extend through silicon nitride layer 11 to reach a plug, 26, of tungsten and be in electrical contact therewith at the upper end of that riser. Plug 26 in turn extends through integrated circuit insulating layer $10^{iv}$ to reach and be in electrical contact with a portion, 27, of the third metal layer of that integrated circuit. This third metal portion is formed of primarily aluminum. A further aluminum plug, 25', extends from the bottom of memory cell structure 23 in FIG. 4 through silicon nitride layer 11 to be in contact with a further tungsten plug, 26', extending through electrical insulating layer $10^{iv}$ to be in contact with another third metal layer interconnection portion, 27'.

Third metal layer interconnection portion 27 in FIG. 4 is in contact with a further tungsten plug, 29, extending through electrical insulating layer 10''' to reach a portion, 30, of the aluminum second metal layer in the integrated circuit. Second metal layer portion 30 is in contact with a further tungsten plug, 31, which extends through electrical insulating layer 10" of the integrated circuit to a portion, 32, of the aluminum first metal layer of the integrated circuit.

Third metal layer interconnection portion 27' in FIG. 4 is in contact with a further tungsten plug, 29', extending through electrical insulating layer 10''' to reach another portion, 30', of the aluminum second metal layer in the integrated circuit. Second metal layer portion 30' is in contact with a further tungsten plug, 31', which extends through electrical insulating layer 10" of the integrated circuit to another portion, 32", of the aluminum first metal layer of the integrated circuit.

First metal layer portion 32 is in contact with a final tungsten plug, 33, extending through electrical insulating layer 10' of the integrated circuit to reach semiconductor material 10 of that integrated circuit, specifically, to be electrically connected to one of the terminating regions, 34, of a metal-oxide-semiconductor field-effect transistor (MOSFET), 35. Terminating region 34 of transistor 35 is formed of an $n^+$-type conductivity material formed in a p-type conductivity material tub, 36, in n-type conductivity semiconductor material 10. Transistor 35 has a further $n^+$-type conductivity material terminating region, 37, formed in p-type conductivity material tub 36. In addition, transistor 35 has an $n^+$-type conductivity polysilicon gate, 38, between terminating regions 34 and 37 separated from tub 36 by a thin gate oxide, 39.

Terminating region 37 has a tungsten plug, 33', extending through electrical insulating layer 10' of the integrated circuit to reach another portion, 32', of the first metal layer of the integrated circuit. In a typical arrangement, first metal layer portion 32' extends to a pad suited for connection to a positive source of voltage, with third metal layer portion 28 connected to a ground reference voltage. In this situation, terminating region 37 serves as a drain for transistor 35 and terminating region 34 serves as a source for transistor 35. If the polarity of the voltage between first metal interconnection layer portion 32' and third metal layer interconnection portion 28 are reversed, terminating region 34 would then serve as the drain for transistor 35 and terminating region 37 would serve as the source. In either situation, memory cell structure 19 and memory cell 19' in FIG. 4, respectively, will have current provided therethrough controlled by transistor 35, and perhaps by others not shown in this figure.

First metal layer portion 32" is in contact with a final tungsten plug, 33", extending through electrical insulating layer 10' of the integrated circuit to reach semiconductor material 10 of that integrated circuit, specifically, to be electrically connected to one of the terminating regions, 34', of another MOSFET, 35'. Terminating region 34' of transistor 35' is formed of an $n^+$-type conductivity material formed in a p-type conductivity material tub, 36', in n-type conductivity semiconductor material 10. Transistor 35' has a further $n^+$-type conductivity material terminating region, 37', formed in p-type conductivity material tub 36'. In addition, transistor 35 has an $n^+$-type conductivity polysilicon gate, 38, between terminating regions 34 and 37 separated from tub 36 by a thin gate oxide, 39.

Terminating region 37 has a tungsten plug, 33', extending through electrical insulating layer 10' of the integrated circuit to reach another portion, 32', of the first metal layer of the integrated circuit. In a typical arrangement, first metal layer portion 32' extends to a pad suited for connection to a positive source of voltage, with third metal layer portion 28 connected to a ground reference voltage. In this situation, terminating region 37 serves as a drain for transistor 35 and terminating region 34 serves as a source for transistor 35. If the polarity of the voltage between the first metal interconnection layer portion 32' and third metal layer interconnection portion 28 are reversed, terminating region 34 would then serve as the drain for transistor 35 and terminating region 37 would serve as the source. In either situation, memory cell structure 19 and memory cell 19' in FIG. 4, respectively, will have current provided therethrough controlled by transistor 35, and perhaps by others not shown in this figure.

First metal layer portion 32" is in contact with a final tungsten plug, 33", extending through electrical insulating layer 10' of the integrated circuit to reach semiconductor material 10 of that integrated circuit, specifically, to be electrically connected to one of the terminating regions 34', of another MOSFET, 35'. Terminating region 34' of transistor 35' is formed of an $n^+$-type conductivity material formed in a p-type conductivity tub 36', in n-type conductivity semiconductor material 10. Transistor 35' has a further $n^+$-type conductivity material terminating region 37', formed in p-type conductivity material tub 36'. In addition, transistor 35' has an $n^+$-type conductivity polysilicon gate, 38', between terminating regions 34' and 37' separated from tub 36' by a thin gate oxide, 39'.

Terminating region 37' has a tungsten plug, 33''', extending through electrical insulating layer 10' of the integrated circuit to reach another portion, 32''', of the first metal layer of the integrated circuit. In a typical arrangement, first metal layer portion 32''' extends to a pad suited for connection to a positive source of voltage. In this situation, terminating region 37' serves as a drain for transistor 35' and terminating region 34' serves as a source for transistor 35'.

The foregoing supplemented external magnetic field switched memory cell magnetoresistive structure shown in FIG. 4 that is assisted in operation by spin momentum transfer and resistive heating electrical currents to reduce the total current required to switch between alternative magnetization states in storing data therein. Although heating such devices to near or above the Curie temperature of one or more ferromagnetic material layers in the "sandwich" layers construction of those devices, or near or above the blocking temperature of one or more antiferromagnetic material layers therein, allows quite small externally applied magnetic fields to switch the magnetization directions thereof, such heating can be reduced through use of spin momentum transfer currents therein.

Figure 6A:
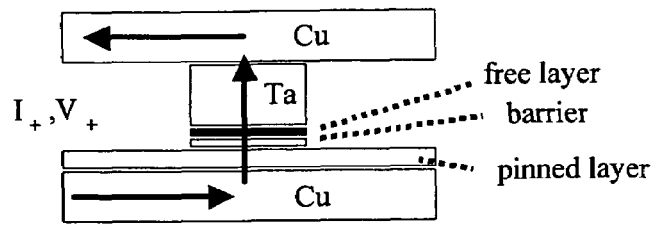
FIG. 6 shows a schematic layer diagram of a cell structure arrangement and a graph with a plot of cell resistance versus switching current.

A schematic illustration in FIG. 6 of the spin momentum transfer assisted switching is shown for a simplified device structure. Two copper electrodes in the device of FIG. 6A have between them, from the bottom up, a pinned magnetization direction ferromagnetic layer, a tunneling barrier layer, a ferromagnetic material free layer and a tantalum conductive layer. The pinned layer is thicker than the free layer to reduce or eliminate stray field coupling with the pinned layer magnetization direction being to the right in the plane of the figure and aligned with the easy axis of the free layer.

Current I is directed from the pinned layer through the free layer with a spin polarization therein set by the magnetization direction of the pinned layer. Spin polarization is often defined within a ferromagnetic layer as a normalized difference between two populations of electrons representing minority and majority carriers, as $P=(n^\uparrow-n^\downarrow)/(n^\uparrow-n^\downarrow)$, where in simple terms, $n^\uparrow$ denotes the fraction of the electrons in a so-called spin up state and $n^\downarrow$ denotes the fraction of the conduction electrons in the oppositely oriented spin down state. The majority carriers are defined as those having spin parallel to the direction of the magnetization of the ferromagnetic layer, and the minority carriers have spin anti-parallel to the direction of the magnetization. A spin-polarized current produces a torque on the magnetization of a ferromagnetic layer properly oriented to reverse the magnetization of the ferromagnetic layer if the spin polarization of the current flowing through the ferromagnetic layer has a component in the direction opposite to the orientation of the magnetization of the ferromagnetic layer. Torque is produced by conservation of angular momentum, L. If the ferromagnetic layer is greater than 10 Å thick, the spin-polarization of the current after passing through the ferromagnetic layer must be oriented such that it is polarized along the majority spin direction of the ferromagnetic layer. The change in orientation of the spin polarization on passing through the ferromagnetic layer is equivalent to a rate of change in angular momentum, dL/dt, which from classical mechanics defines a torque.

Figure 6B:
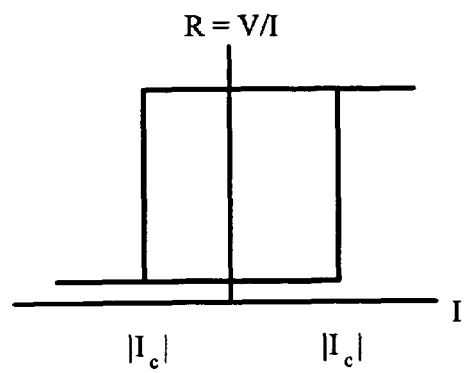
Figure 7:
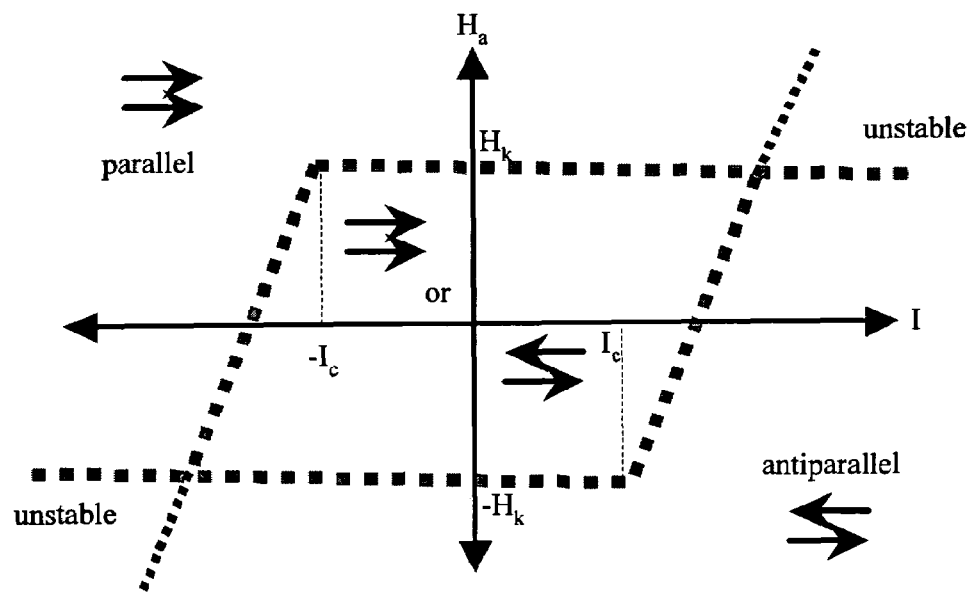
FIG. 7 shows a graph with a plot related to the plot of FIG. 6.

Hysteresis shown in the device resistance versus supplied current plot of FIG. 6B indicates that the device magnetic state, the states thereof being the two opposite magnetization direction orientations along the free layer easy axis, can be selected by choosing the flow direction of currents through the device of a sufficient magnitude. The current value $I_c$ is the value of current I necessary to reverse the direction of the free layer magnetization. Thus, as opposed to the use of only heating to assist in the switching of magnetization directions as is done in magnetothermal magnetoresistive memory cells, the additional utilization of spin momentum transfer for additional assistance to reduce magnitudes of externally applied magnetic fields, and so the magnitudes of electrical currents necessary to generate them, will require the use of a bipolar current supply to produce the heating current and the corresponding spin momentum transfer. The spin momentum transfer critical current, $I_c$, the predicted spin momentum transfer current for reversing the magnetization of a single domain thin film ferromagnet through the spin momentum transfer effect in zero temperature simulations is only weakly dependent on the externally applied magnetic field, $H_a$, until $H_a$ is very near the uniaxial anisotropy field of the film, $H_k=2K_{eff}/M_s$ as can be seen in FIG. 7. At elevated temperature and in real magnetic structures where the magnetization is not a single domain, simulations predict there is a benefit in combining spin momentum transfer, an externally applied magnetic field, and heating to cause magnetization direction reversals in a ferromagnetic material film. Thin ferromagnetic film at ~100 nm dimensions are not strictly single domain, and thermal fluctuations in real magnetic material layers cause reversal at $H_a<H_k$ on short time scales. The spin momentum transfer critical current value $I_c$ value should thus depend more strongly on externally applied magnetic fields at elevated temperature. This is shown below using a heat equation solver that was developed and integrated with a Langevin dynamic (LD) micromagnetic solver. Simulations of a 130 nm×90 nm×3.6 nm elliptically shaped nickel-iron magnetoresistive random access memory (MRAM) cell are presented below to illustrate the potential benefit of designing a magnetothermal MRAM cell to take advantage of all three phenomena.

Providing for lowering the current $I_c$ as required to program the memory cell, the device structure shown in FIG. 4 has two improvements over the simplified structure shown in FIG. 5A in addition to thermal resistance control via layers 12 and 22. First, there are two oppositely oriented relatively fixed magnetization layers, 14 and 18. Second, there is a conductive spacer between free layer 16 and fixed magnetization layer 18. The oppositely oriented magnetizations of fixed magnetization layers, 14 and 18, increase the spin polarization of the current flowing through free layer 16, while conductive spacer layer 17 permits the entire sequence of layers in the device overall to show magnetoresistance based signal voltage values representing the corresponding magnetic states of the device.

In connection with describing the increase in spin polarization below, assume that fixed magnetization layer 14 has a magnetization direction oriented to the left and fixed magnetization layer 18 has a magnetization direction oriented to the right. Assume also that free layer 16 has a magnetization direction oriented to the right and so the current in interconnection 22" flows into the figure to aid in switching this magnetization direction. If the voltage applied between layers 22 and 12 is such that fixed magnetization layer 18 has a positive polarity compared to fixed magnetization layer 14, then electrons flow from layer 14 into through layers 15, 16, and 17 into layer 18. Because layer 14 has a fixed magnetization direction oriented to the left in FIG. 4 by assumption, the electrons passing through AlOx barrier layer 15 and into ferromagnetic free layer 16 are preferentially spin-polarized to the left. Due to the assumed right oriented magnetization direction of free layer 16, electrons passing through free layer 16 and into fixed magnetization layer 18 are preferentially spin-polarized to the right. Because there are two spin populations, the minority and the majority carriers, some fraction of the electrons passing through free layer 16 are in the minority spin state and spin polarized to the left. At the interface between conductive spacer layer 17 and ferromagnetic fixed magnetization layer 18, some scattering of the electrons may occur. Electrons that are spin-polarized opposite to the direction of the magnetization in fixed magnetization layer 18 will be preferentially scattered back into free layer 16. This spin-dependent scattering effect increases the population of left polarized electrons in layer 16, thus increasing the torque on layer 16.

Reversing the polarity of the applied voltage causes free layer 16 to be written into the opposite state. For the purpose of describing the increase in spin polarization under opposite current bias condition, assume again that fixed magnetization layer 14 has a magnetization direction oriented to the left in FIG. 4 and fixed magnetization layer 18 has a magnetization direction oriented to the right. Assume also that free layer 16 has a magnetization oriented to the left and so the current ib interconnection 22" is chosen to be out of the figure. If the voltage applied between layers 22 and 12 is such that layer 14 has a positive polarity compared to layer 18, then electrons flow from layer 18 into through layers 17, 16 and 15 and into layer 14. Because layer 18 has a magnetization oriented to the right by assumption, the electrons that are passing through conducting spacer layer 17 and into ferromagnetic free layer 16 are preferentially spin-polarized to the right. Due to the assumed left oriented direction of magnetization of free layer 16, electrons passing through free layer 16 and into pinned layer 18 are preferentially spin-polarized to the left. Because there are two spin populations, the minority and the majority carriers in layer 16, some fraction of the electrons passing through free layer 16 are in the majority spin state and spin polarized to the right. Spin-dependent scattering of the electrons may occur at the insulating tunnel barrier layer 15, preferentially scattering electrons with right oriented spin-polarization back into free layer 16. This spin-dependent scattering effect increases the population of right polarized electrons in layer 16, thus increasing the torque tending to align freelayer 16 into the right oriented magnetization direction. Thus, reversing the polarity of the applied current through the device results in a differently oriented torque on free layer 16, and that the spin amplification effect produced by the oppositely oriented magnetizations directions of the fixed magnetization layers is a reversible effect.

Oppositely magnetization direction oriented fixed magnetization layers 14 and 18 thus increase the effective spin polarization of the electron current passing through free layer 16 in both directions. In order to maximize the increase in spin-polarization produced by the oppositely oriented magnetization directions of fixed magnetization layers 14 and 18, the resistance of the insulating spacer layer 15 must not be too much different from that of conducting spacer layer 17; otherwise, spin accumulation due to the mismatch in resistances might change the reflection and transmission probabilities of the interfaces in the layers sequence of the device. Meeting this need requires that insulating layer 15 be very thin.

Unfortunately, the opposite direction orientation of the ferromagnetic pinned layers' magnetizations produces a complication when attempting to use the resistance measured between layers 12 and 22 as a measure of the orientation of the magnetization of free layer 16 representing the magnetic state of the device. This is the reason for using a copper conducting spacer layer 17, rather than two insulating tunnel barriers. Tunneling magnetoresistance between two ferromagnetic layers is large when the magnetizations of the two ferromagnetic layers are in a parallel orientation. In the case of a free layer "sandwiched" between two oppositely oriented fixed magnetization layers as in the device depicted in FIG. 4, the relative orientation of the magnetization across spacer layer 15 is necessarily opposite to that across spacer layer 17. In this arrangement, any gain in magnetoresistance across one of the spacer layers is cancelled by a drop in magnetoresistance across the opposite layer if the magnitude of the magnetoresistance effect of a copper spacer layer is much smaller than the tunneling magnetoresistance effect produced across an insulating barrier like AlOx, and so the use of a copper spacer layer 17 permits a magnetoresistance value change to be measured between layers 12 and 22 because the magnetoresistance of layer 17 is too small to cancel that produced across layer 15.

Micromagnetic models for studying spin momentum transfer at non-zero temperatures and to study probabilistic switching behavior are often based on the stochastic Landau-Lifshitz-Gilbert (sLLG) equation combined with an additional spin momentum transfer torque term:

$$\frac{d\vec{M}}{dt} = -\gamma \vec{M} \times \vec{H}_{eff} - \gamma \alpha M_s \hat{m} \times (\hat{m} \times H_{eff}) - \gamma J_{SI} M_s \hat{m} \times (\hat{m} \times \hat{m}_p).$$

Here, the first and second terms on the right hand side of the equation are the usual precession and damping terms, and the third term represents spin momentum transfer from a fixed ferromagnetic layer oriented in the direction $m_p$. "$\vec{M}$" is the magnetic moment vector of a computational cell, "t" is the time, $\gamma$ is the gyromagnetic constant, $\alpha$ is the damping parameter, $m=M/M_s$, "$J_{SI}$" is a function of relative magnetization angle and spin polarization, $\eta$, is related to spin injected current density, and $H_{eff}=H_{exc}+H_c+H_k+H_{ext}+H_1+H_{ns}$, the total local vector magnetic field within the ferromagnetic object due to exchange, demagnetization, anisotropy, external sources, current, and thermal agitation, respectively. The first four of these effective magnetic field source terms are well known. The nonuniform magnetic field due to current passing through the magnetic materials and the method for including temperature in the simulation are described below since they are less commonly attempted.

The nonuniform field due to the current in the model, $H_1$, is computed for all current flowing within the simulation mesh using $$\begin{bmatrix} B_x(\vec{R}_{test}) \\ B_x(\vec{R}_{test}) \\ B_x(\vec{R}_{test}) \end{bmatrix} \begin{bmatrix} 0 & \Delta x F(\Delta x, -\Delta z, \Delta y, L_y) & -\Delta y F(\Delta x, \Delta y, \Delta z, L_z) \\ -\Delta z F(-\Delta z, \Delta y, \Delta x, L_x) & 0 & \Delta x F(\Delta x, \Delta y, \Delta z, L_z) \\ \Delta y F(-\Delta z, \Delta y \Delta x, L_x) & -\Delta \times F(\Delta x, -\Delta z, \Delta y, L_y) & 0 \end{bmatrix} \begin{bmatrix} I_x(\vec{R}_{source}) \\ I_x(\vec{R}_{source}) \\ I_x(\vec{R}_{source}) \end{bmatrix}$$

-continued $$F(a, b, c, L) = \frac{10^{-7}}{a^2 + b^2} \left\{ \frac{L/2 - c}{\sqrt{a^2 + b^2 + (L/2 = c)^2}} + \frac{L/2 + c}{\sqrt{a^2 + b^2 + (L/2 + c)^2}} \right\}.$$

In this notation, "test" indicates the point where the B field from a current filament at the "source" point is computed. The deltas are thus $\Delta x = x_{test} - x_{source}$, $\Delta y = y_{test} - y_{source}$, and $\Delta z = z_{test} - z_{source}$.

The Gaussian distributed $H_{ns}$ field is a sequence of random field values used to simulate the effects of temperature. Heat energy as represented on a material constituent average by temperature is often considered as a vibration or fluctuation. In terms of magnetics, magnetic temperature can be considered as representing a local interaction between lattice vibrations, or phonons, and conduction electrons and the magnetization. These interactions produce random local uncorrelated perturbations in the local direction of the magnetization, which could be thought of as a local random field contribution proportional to temperature and damping. In this spirit, $H_{ns}$ is thus computed as a sequence of Gaussian distributed delta-correlated random field values (white noise) calculated using the well known Box-Müller algorithm. Hns is defined by $$H_{ns}(t) = \sqrt{2\alpha k_B T/(\gamma M_s V \Delta t)} \aleph(t), \text{ where } \aleph(t)$$

is a Gaussian distributed random sequence with standard deviation equal to one and zero mean. This representation of $H_{ns}$ follows directly from the fluctuation-dissipation theorem, which relates lossy dynamics (such as those produced by damping in the sLLG equation) and temperature to a fluctuation magnitude.

The sLLG equation is used to predict the time dependence of the magnetization. The sLLG equation is actually a Langevin equation for the dynamics of the magnetization of a ferromagnet. It may be written in the following form using $$\vec{H}_{det} = \vec{H}_{exc} + \vec{H}_d + \vec{H}_k + \vec{H}_{ext} + \vec{H}_I :$$

$$\frac{d\vec{M}}{dt} = -\gamma \vec{M} \times (\vec{H}_{det} + \vec{H}_{ns}) -$$

$$\gamma \alpha M_s \hat{m} \times (\hat{m} \times (\vec{H}_{det} + \vec{H}_{ns})) - \gamma J_{SI} M_s \hat{m} \times (\hat{m} \times \hat{m}_p)$$

$$\frac{d\vec{M}}{dt} = \{-\gamma \vec{M} \times \vec{H}_{det} - \gamma \alpha M_s \hat{m} \times (\hat{m} \times \vec{H}_{det})\} +$$

$$\{-\gamma \alpha \vec{M} \times \vec{H}_{ns} - \gamma \alpha M_s \hat{m} \times (\hat{m} \times \vec{H}_{ns})\}$$

$$\frac{d\vec{M}}{dt} = \frac{d\vec{M}}{dt_{deterministic}} + \frac{d\vec{M}}{dt_{random}}$$

containing a deterministic and stochastic or random contribution. This is a Langevin equation, since it relates a rate of change of an observable variable to a deterministic behavior plus a stochastic contribution relating to damping (dissipation) and temperature. The random contribution produces a different solution to the problem each time it is solved provided the noise generator is seeded differently each time the problem is solved. To directly determine switching probabilities, the sLLG equation needs to be solved for hundred or thousands of reversals, each simulation using a differently seeded random number sequence in order to introduce the random fluctuations into the simulation. For time scales longer than tens of microseconds or objects larger than a few microns, this is computationally impossible on a typical desktop workstation. An alternative equation describing the time evolution of the probability distribution of M(t) solutions to the sLLG equation may be derived called a Fokker-Planck (FP) equation. A FP equation is often written as a continuity equation $$\frac{\partial \rho(\vec{M}, t)}{\partial t} = -\nabla \cdot j(\vec{M}, t),$$

where $\rho(\vec{M},t)$ is the probability distribution of M at time t per unit area of a surface of all possible solutions, and $j(\vec{M},t)$ is a probability current density along the solution surface. For the sLLG equation, we have $$j(\vec{M}, t) = \rho(\vec{M}, t) \frac{d\vec{M}}{dt_{deterministic}} - \frac{\gamma M_s \alpha k_B \tilde{T}}{V} \nabla \rho(\vec{M}, t).$$

There is a deterministic portion and a diffusive portion to the probability current. The diffusive portion depends on temperature and damping. Note that the diffusive portion depends on a scaled temperature, described below, that is equal to the ambient temperature in the absence of spin-polarized current. In general, this equation is very difficult to solve. Solution of the above FP equation with $J_{SI}=0$ yields the so-called Neel-Brown switching probability described by P($\Delta$t, T, $\Delta$E)=

$$P_0 e^{-\Delta t/\tau} \text{ and } \tau = \frac{1}{f_0} e^{\Delta E/k_B T}.$$

The implications of spin injection can be determined by examination of the sLLG equation in the presence of thermal agitation and the spin-injection torque. The Slonczewski $\hat{m} \times (\hat{m} \times \hat{m}_p)$ representation of the spin momentum transfer torque is the most commonly accepted form because of predicting behavior that closely matches experimental observations. The addition of this term to the sLLG equation has an interesting consequence in that it produces a current and magnetization orientation dependent change in the effective damping parameter of the material. Consider the case where $m_p$ is parallel to $H_{eff}$. In this case, the sLLG equation can be rewritten as $$\frac{d\vec{M}}{dt} = -\gamma \vec{M} \times \vec{H}_{eff} - \gamma \tilde{\alpha} M_s \hat{m} \times (\hat{m} \times \vec{H}_{eff}) \text{ with } \tilde{\alpha} = \alpha \pm \frac{J_{SI}}{H_{eff}}.$$

The effective α is lowered (or raised) by the spin momentum transfer torque, causing magnetic excitations to damp out more slowly (or quickly) in time, depending on the orientation of $m_p$. If $\alpha$ is changed, to $\tilde{\alpha}$ throughout the entire sLLG equation, the solution of the equation would be little changed. Unfortunately, $\alpha$ in the random term is not affected by $J_{SI}$. More specifically, consider $$\frac{dM}{dt} = -\gamma \vec{M} \times \vec{H}_{eff} - \gamma \tilde{\alpha} M_s \hat{m} \times (\hat{m} \times \vec{H}_{eff})$$

$$= -\gamma \vec{M} \times (\vec{H}_{det} + \vec{H}_{ns}) - \gamma \tilde{\alpha} M_s \hat{m} \times (\hat{m} \times (\vec{H}_{det} + \vec{H}_{ns}))$$

and recall that $H_{ns}(t)=\sqrt{2\alpha k_B T/(\gamma M_s V \Delta t)}\aleph(t)$. We may thus rewrite $H_{ns}(t)=\sqrt{2\tilde{\alpha} k_B \tilde{T}/(\gamma M_s V \Delta t)}\aleph(t)$, suggesting the effective temperature of the magnetic system is $\tilde{T}=(\alpha/\tilde{\alpha})T$. This implies that spin momentum transfer torque should raise (or lower) the apparent magnetic temperature of the sample, when the spin polarization of the current is collinear with the magnetization of the free layer. Experimentally, it is difficult to separate $\tilde{T}$ from a change of $\Delta E$ in switching measurements, since most measured quantities are dependent on the ratio $S=\Delta E/k_B T$. In any case, the apparent increase in $\tilde{T}$ or lowering of $\Delta E$ should facilitate magnetic reversal at lower H or T.

Heat flow due to Joule heating at the tunnel barrier is simulated using the heat equation modified for use in nonuniform materials and to include temperature dependent material parameters:

$$\rho_m(x,y,z)C_p(x,y,z)\frac{\partial T(x,y,z)}{\partial t} =$$
$$\nabla \cdot [k(x,y,z)\vec{\nabla}T(x,y,z)] + g(x,y,z,T,t).$$

Here, $\rho_m$ is the local density, $C_p$ the local heat capacity, T the local temperature, k the local thermal conductivity, and g(x,y,z,T,t) is the time and temperature dependent local power generation in the simulated device. For Joule heating in materials with temperature dependent resistivity, the power generation term is expressed as $$g(x,y,z,T,t)=J^2(x,y,z,t)\rho(x,y,z,T),$$

where the local current density, J, is dependent on time, and the local resistivity, $\rho$, is dependent on temperature. The above heat equation was discretized using a Crank-Nicolson finite-difference approach. The resulting set of matrix equations are efficiently solved in 3D using a sparse-matrix preconditioned successive-over-relaxation solver.

Figure 8:
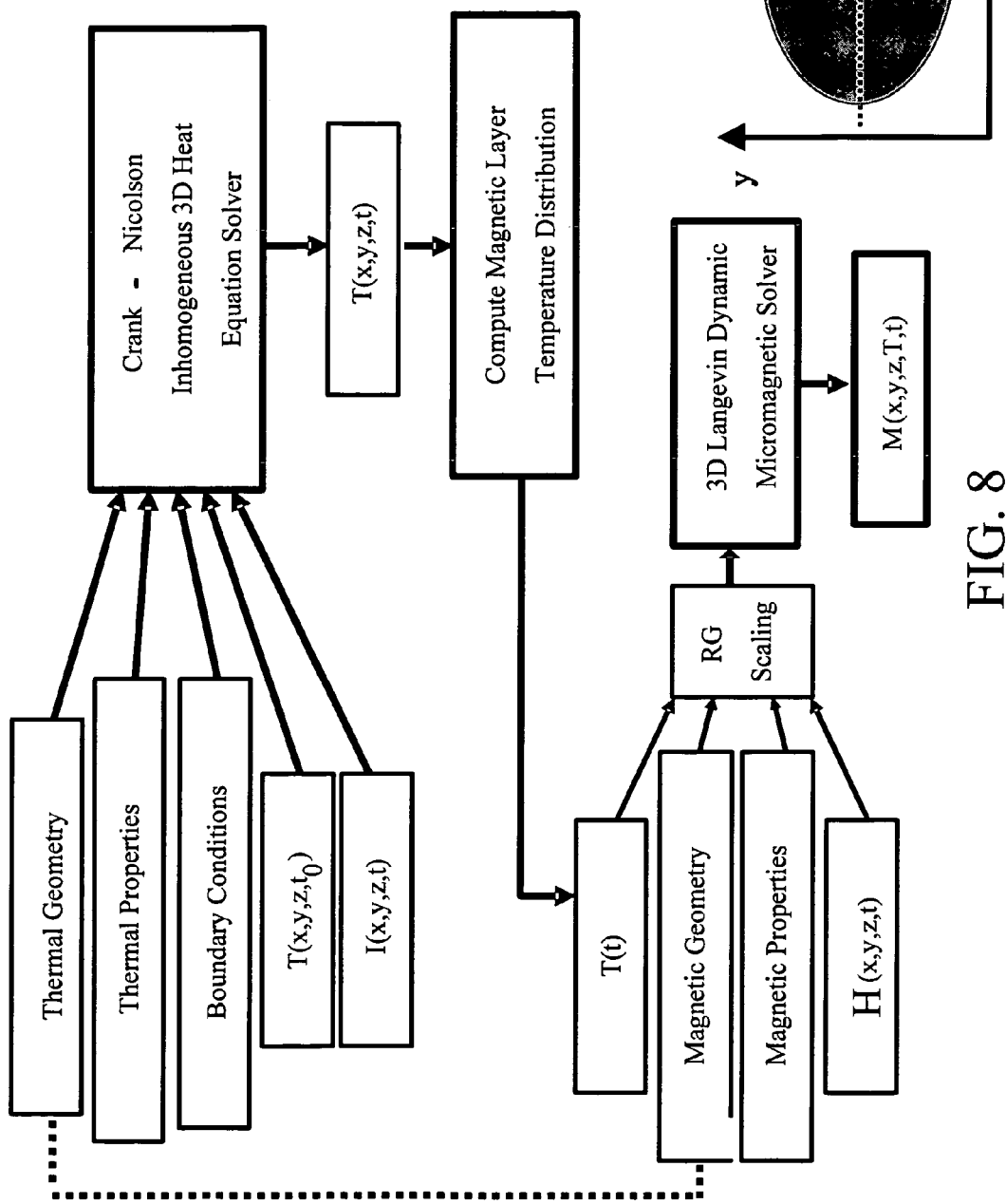
FIG. 8 shows a block diagram of a cell simulation arrangement.

The integrated thermal-micromagnetic-spin momentum transfer simulation method is outlined in FIG. 8. Note that the block labeled "RG Scaling" indicates that renormalization group scaling of the micromagnetic simulation input parameters is applied to account for errors resulting from truncation of short wavelength excitations in the simulated spin lattice due to the coarse grained mesh (5 nm×5 nm×3.6 nm). The well known method of Grinstein and Koch has been applied to perform this scaling correction.

Figure 9:
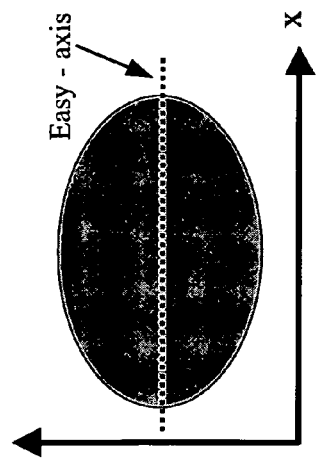
FIG. 9 shows a representation of an anisotropic ferromagnetic material layer and related simulation coordinates.

The simulated structure is shown schematically in FIG. 9 with the x-axis serving as the uniaxial anisotropy, or easy, axis in a nickel iron (80%, 20%) ferromagnetic material with dimensions of 130 NM by 90 NM. The simulation of this structure demonstrates a unique thermally assisted data storage method where the temperature of the sense layer does not need to exceed Tc: Oe is lowered by the applied field and spin momentum transfer so that the sense layer magnetization thermally activates over the energy barrier OE on a short time scale.

The simulated device sandwiches the free layer between two oppositely oriented pinned layers. The free layer is separated from one pinned layer by an aluminum oxide (Alex) tunnel barrier spacer and from the other by a copper (Cu) spacer. Since the Alex barrier magnetoresistance is much greater than that of the Cu spacer, this structure can have a large magnetoresistance. The oppositely oriented pinned layers effectively double the spin polarization in the free layer since across one spacer, spin polarized electrons are reflected and those across the other are transmitted. In order to simulate this stack, an effective $\eta=0.9$ was thus used. For the present work, tunneling hotshot through the barrier are neglected, but simulations restricting tunnel current to an area of about 10% of the Alex spacer show more than a 50% reduction in the spin momentum transfer critical current $I_C$. Efficiency would be further improved using a low Curie temperature ferromagnetic material free layer. Thermal parameters and geometry used for simulation are listed in Table 1 below. The free layer is composed of permalloy, $M_s=8\times10^5$ A/m, $A=10^{-11}$ J/m, $\alpha=0.02$, and $T_c=850$ K. The tunnel barrier has a resistivity of ~5 $\Omega\mu m^2$, which assuming a 200 mV damage threshold, safely permits about 300 μA of current.

|       | Bckgnd   | TV       | AF1   | P1    | AlOx  | Free  | Cu      | P2     | AF2   | TV       | units  |
|-------|----------|----------|-------|-------|-------|-------|---------|--------|-------|----------|--------|
| K     | 3.00E−03 | 1.40E−02 | 0.01  | 0.197 | 0.014 | 0.197 | 4.01    | 0.197  | 0.01  | 1.40E−02 | W/cm-K |
| DENS  | 2.2      | 2.2      | 12    | 8.7   | 2.2   | 8.7   | 6.93    | 8.7    | 12    | 2.2      | g/cc   |
| C     | 1.05     | 1.05     | 0.277 | 0.5   | 1.05  | 0.5   | 0.385   | 0.5    | 0.277 | 1.05     | J/g-K  |
| RHO   | 100      | 0.001    | 0.001 | 0.001 | 0.716 | 0.001 | 1.70E−06| 0.0001 | 0.001 | 0.001    | ohm-cm |
| LX    | 300      | 51       | 130   | 130   | 130   | 130   | 130     | 130    | 130   | 51       | NM     |
| LY    | 300      | 51       | 90    | 90    | 90    | 90    | 90      | 90     | 90    | 51       | NM     |
| Lz    | 156      | 64       | 8     | 4     | 2     | 4     | 2       | 4      | 8     | 60       | NM     |
| Level | 0        | 0        | 64    | 72    | 76    | 78    | 82      | 84     | 88    | 96       | NM     |
| Shape | Rect.    | Ellipse  | Ellipse | Ellipse | Ellipse | Ellipse | Ellipse | Ellipse | Ellipse | Ellipse | char   |

Figure 10A:
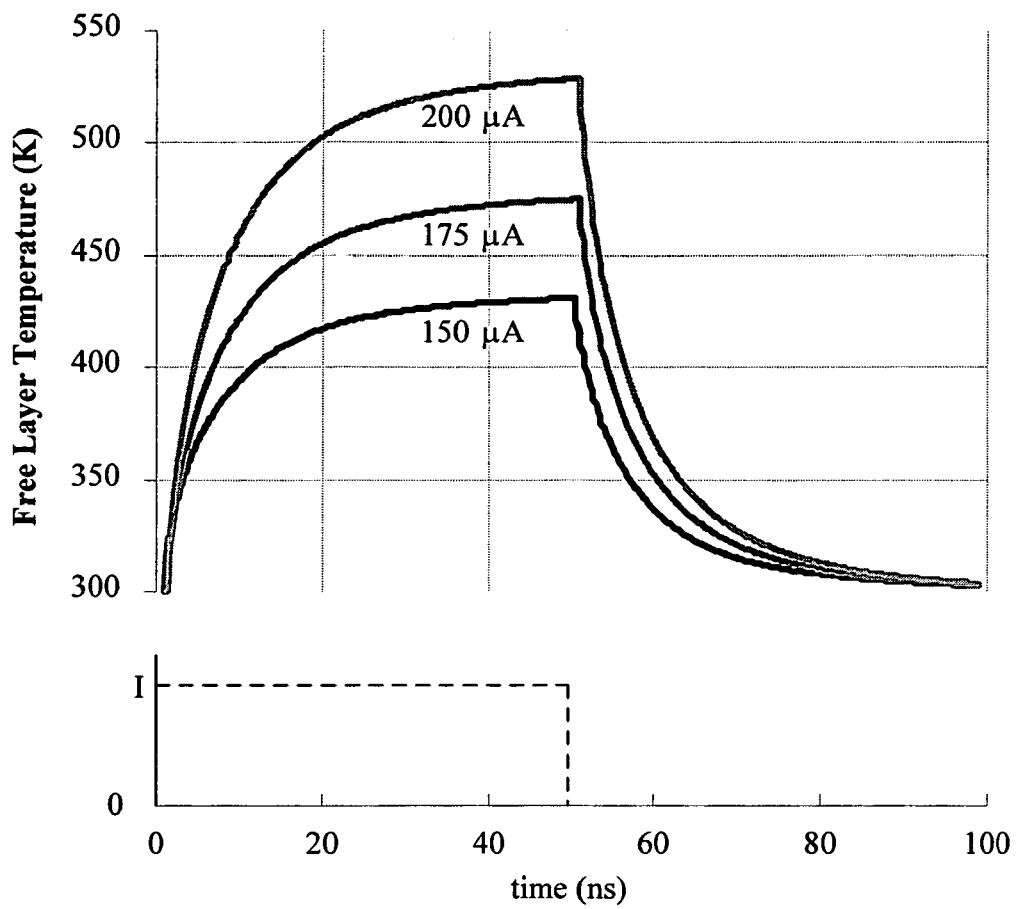
FIG. 10 shows a graph with a plot related to the plot presenting simulation results for the structure of FIG. 4.
Figure 10B:
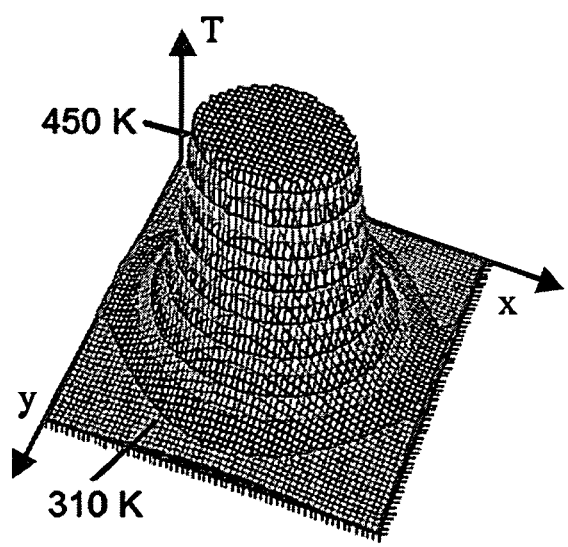

Joule heating results are shown in FIG. 10 with FIG. 10A being a graph with plots showing the free layer heating response to a 50 ns current pulse plotted therebelow. FIG. 10B shows a corresponding areal temperature distribution. The temperature of the free layer is uniform to better than 1%, and the average temperature is thus used for the micromagnetic simulation. The time constants associated with Joule heating of the suggested structure are sufficient for a memory device.

There are several methods by which heating can be used to lower data storage currents in a memory cell. In the case of using such heating to cause the ferromagnetic material free layer to exceed the Curie point temperature thereof in such a data storage operation, that is, this layer is heated above Curie point temperature so that storage current becomes very small, spin momentum transfer may be used to reduce switching time and improve error rate since it will assist the applied field in aligning the spins of the FM-Free layer to the correct orientation in the high temperature paramagnetic state. If cooling is fast enough, this will decrease the likelihood of freezing in a vortex or domain wall. This decreased error rate can be translated into a lower cell storage current to achieve a desired error rate.

Figure 1:
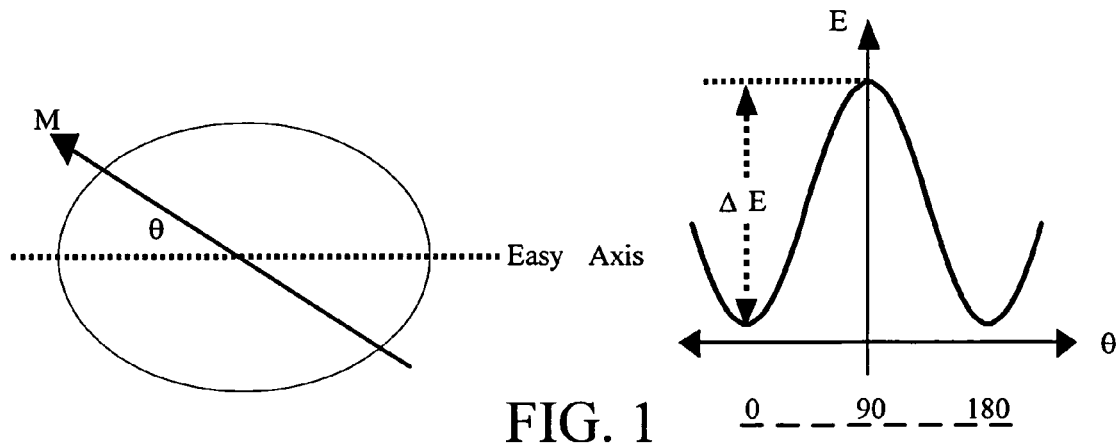
FIG. 1 shows a representation of an anisotropic ferromagnetic material layer and graph with a plot of the rotational switching energy thereof.
Figure 2:
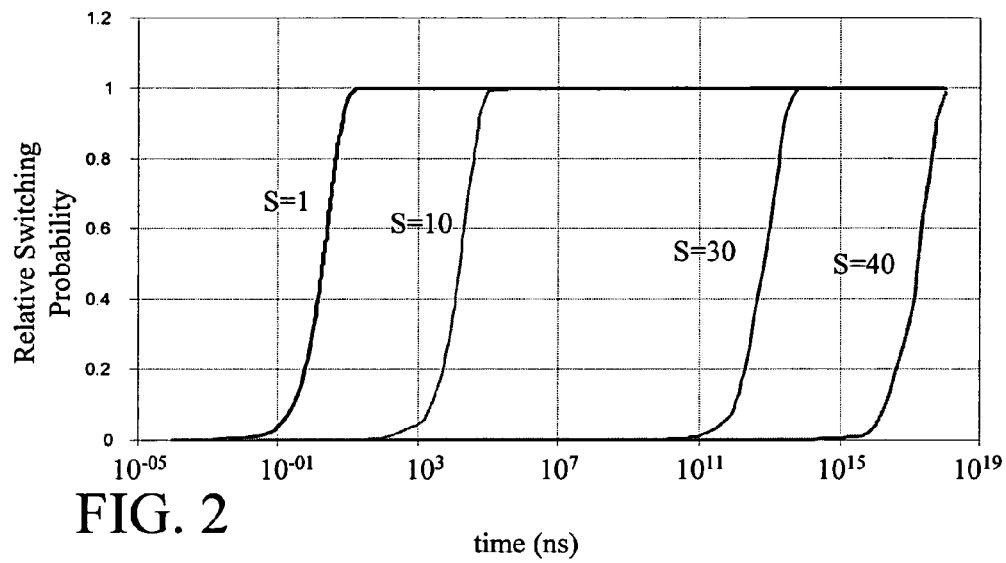
FIG. 2 shows a graph with a plot of the relative switching probability versus values of the stability factor and retention time.
Figure 3:
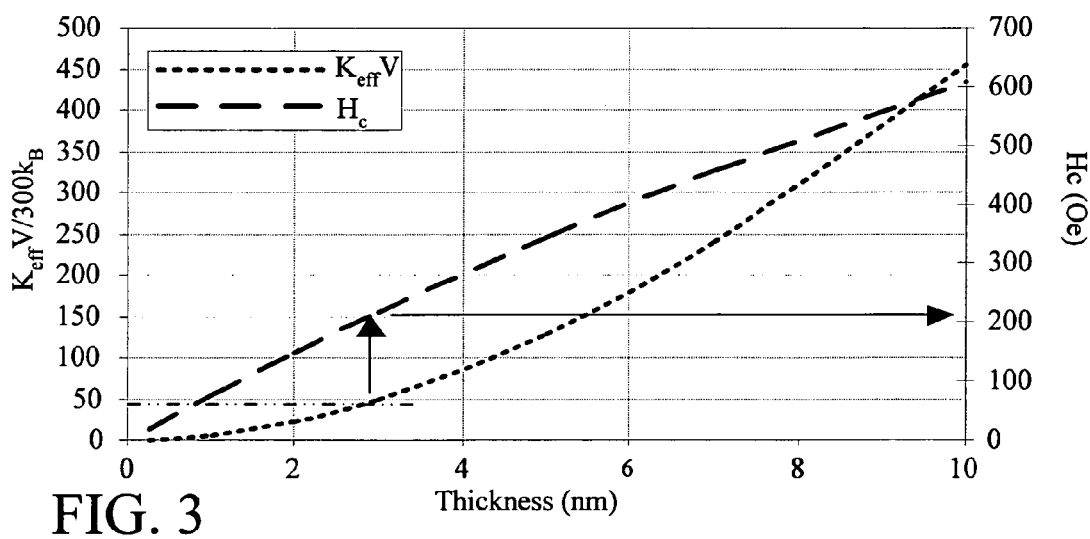
FIG. 3 shows a graph with a plot showing the results of increasing free layer thicknesses.

Another thermal writing method, which could be called thermally-assisted storage, is illustrated in FIG. 11. In this method, the bit data is stored by thermally escaping over a reduced energy barrier in the presence of an externally applied magnetic field and spin momentum transfer. The fields and current sequences need not necessarily be applied in the order shown for this illustration. FIG. 11A corresponds to the situation shown in FIG. 1 with the cell unactivated. In FIG. 11B, the applied reversal field lowers the energy barrier, and lowers one energy well with respect to the other. Increasing the temperature as shown in FIG. 11C increases thermal fluctuations.

Figure 11A:
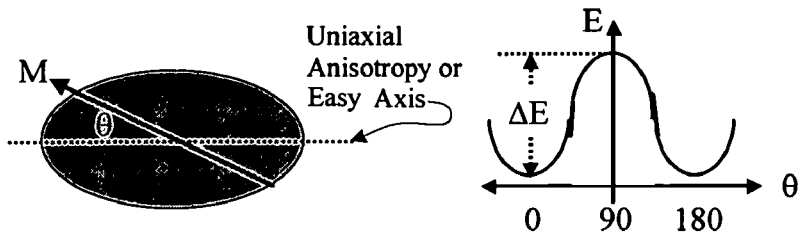
FIG. 11 shows a series of representations of an anisotropic ferromagnetic material layer and corresponding graphs with plots of the rotational switching energy thereof in various conditions.
Figure 11B:
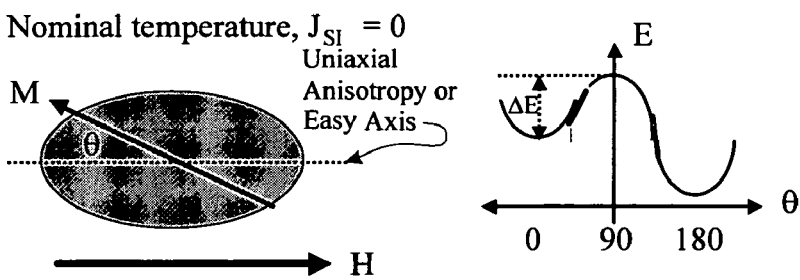
Figure 11C:
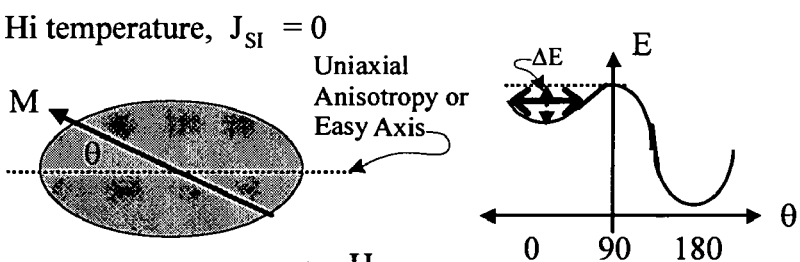
Figure 11D:
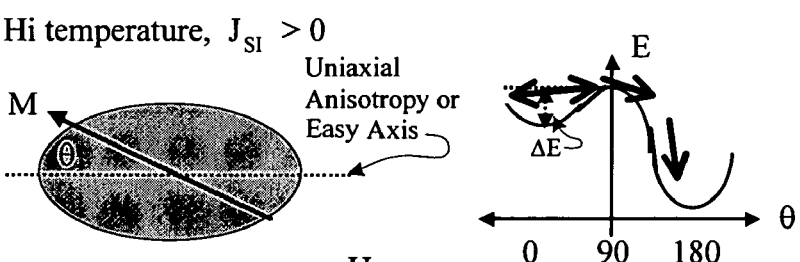

If the thermal energy is not sufficient to overcome the energy barrier, spin momentum may be used to further increase fluctuation amplitude or the effective energy $k_B T$, and that causes the magnetization to thermally escape the local minimum at zero degrees and fall into the reversed or 180° rotated magnetization direction state as shown in FIG. 11D. To emphasize the point, this method differs from the Curie point data storage described above in that the OE barrier is not reduced to zero at the elevated write temperature. The memory cell is made superparamagnetic by the thermal agitation and spin momentum transfer induced spin waves on the time scales of data storage operations. There are advantages to using an FM-Free layer material with a Curie point temperature close to the data storage temperature, since this would further lower the barrier as T is increased, and could result in a very low storage current device without having to develop a material with a very low Curie point temperature that retains a large spin-polarization and shows a large magnetoresistance in the proposed magnetic tunnel junction structure.

Micromagnetic simulation results of thermally assisted writing are shown in FIG. 12. FIG. 12A shows that increased temperature strengthens the dependence of the spin momentum critical current $I_C$ on $H_a$ and decreases the magnitude of that value. FIGS. 12B through 12D illustrate the combined effect of spin momentum transfer, Joule heating, and an externally applied magnetic field for a common structure. They illustrate the result of including or omitting spin momentum transfer.

Other different, but similar, device structures can prevent the occurrence of spin momentum transfer such as (a) one using SAF based "pinned" layers, rather than ferromagnetic material only layers, that thereby decreases spin polarization in the switching current, or one using (b) top and bottom "pinned" layers having the same magnetization directions rather than opposed to thereby have reflected spin polarized electrons with spins opposed to those of initially transferred electrons, or one using (c) switching currents flowing in only one direction through the device. These last structures are thus less suitable for spin momentum transfer thermally assisted data storage in magnetoresistive memory cell devices.

FIGS. 12B through 12D show that at low storage currents and thus low temperature, neither $H_a$ nor $H_a$ combined with just spin momentum transfer can reverse the bit, but that at higher storage currents or at higher temperatures, Ha alone can be used to store the data in a bit. Spin momentum transfer combined with heat and an externally applied magnetic field allows fabricating a stable, small magnetoresistive memory cell that can have data stored therein at lower values of switching current through the AlOx layer than one that only uses Joule heating.

Thus, the foregoing LD micromagnetic simulation suggests that increasing temperature increases the dependence of spin momentum transfer on the externally applied magnetic field. Hence, an MRAM memory cell that takes advantage of spin momentum transfer, Joule heating, and externally applied magnetic fields can provide a very energy efficient, rapidly operating cell. Storing data in such an MRAM cell utilizes that combination of spin momentum transfer, heat, and applied field. Spin momentum transfer and an applied magnetic field allow thermally assisted storage of data in a MRAM cell without the need to heat the free layer above its Curie temperature at switching currents lower than would be needed if only Joule heating and H were used to overcome the energy barrier BE. For the particular geometry and materials describe above, the use of spin momentum transfer provides roughly a 15% reduction in write current.

Tunnel barriers are never perfectly smooth, and because the tunneling resistance depends exponentially on the thickness of the tunnel barrier, tunneling hotspots with a high local concentration of tunnel current will be present. Tunneling hotspots are beneficial for lowering the programming current of magnetothermal spin-momentum-transfer assisted switching. First, a distribution of tunneling hotspots can cause the temperature of the freelayer in the vicinity of the hotspot to locally exceed the Curie temperature of the freelayer ferromagnetic material. If these local hotspots are distributed such that the high temperature regions are nearly percolated throughout the freelayer, then the freelayer can effectively be broken up into superparamagnetic clusters. As a whole then it behaves as if the energy barrier is significantly decreased over the case of uniform heating current. Simulation and measurement indicate that this hotspot effect can lower the current required to heat magnetothermal MRAM by at least a factor of three. Second, simulation of spin-momentum transfer assisted switching in the absence of heating but with the current concentrated in a tunneling "hotspot" at 10% of the total junction area shows switching at reduced current, and can potentially reduce the write current by another 50% below the uniform current simulation results described above.

Further simulations have shown that decreasing the Curie temperature of the free layer to 500 K allows a device of the same dimensions to be built that could be written at switching currents of less than 100 μA through the memory cell despite that 100 μA provides only about 50 K of temperature change.

Although the present invention has been described with reference to preferred embodiments, workers skilled in the art will recognize that changes may be made in form and detail without departing from the spirit and scope of the invention.

The invention claimed is:

1. A ferromagnetic thin-film based digital memory, said memory comprising:

a substrate;

a plurality of bit structures, each supported on said substrate and separated from one another by spacer material therebetween, that are electrically interconnected with information storage and retrieval circuitry, said bit structures each comprising first and second relatively fixed magnetization layers each with a magnetization direction substantially opposite one another and formed of materials selected from only ferromagnetic and antiferromagnetic materials, and a ferromagnetic material film in which a characteristic magnetic property is substantially maintained below a first critical temperature above which such magnetic property is not maintained, and with said ferromagnetic material film being separated from said first relatively fixed magnetization layer by a first intermediate layer of a nonmagnetic material having first and second major surfaces and further being separated from said second relatively fixed magnetization layer by a second intermediate layer of a nonmagnetic material having first and second major surfaces with said nonmagnetic material of one of said first and second intermediate layers being electrically insulative and that one remaining being electrically conductive, said bit structures each having a first interconnection structure providing electrical contact thereto positioned against a first contact surface thereof substantially parallel to said major surfaces of said first and second intermediate layers and also between said first contact surface and said substrate; and a plurality of word line structures each having a pair of word line end terminal regions adapted to conduct electrical current in at least one direction therethrough, each of said pairs of word line end terminal regions having an electrical conductor electrically connected therebetween which is located on an opposite side of said first and second intermediate layers of a corresponding one of said bit structures from said first interconnection structure providing electrical contact thereto, said information storage and retrieval circuitry for drawing electrical current selectively through each said bit structure and said first interconnection structure providing electrical contact thereto to raise temperatures of said ferromagnetic material film therein while being above temperatures of at least an adjacent said bit structure because of sufficient extent of, and smallness of thermal conductivities of, at least portions of said selected bit structure and of those portions of said substrate and said spacer material positioned thereabout.

2. The device of claim 1 wherein said plurality of word line structures each has said electrical conductor therein located across said spacer material from said corresponding one of said bit structures, and wherein each of said bit structures has a second interconnection structure providing electrical contact thereto positioned against a second contact surface thereof substantially parallel to said first and second intermediate layer first and second major surfaces located on an opposite side of said first and second intermediate layers therein from said first interconnection structure also providing electrical contact thereto.

3. The device of claim 2 further comprising said plurality of bit structures each having a relatively high thermal resistance material layer located between said first intermediate layer and said first interconnection structure which has a thermal diffusivity less than that of said first interconnection structure, and another relatively high thermal resistance material layer located between said second intermediate layer and said second interconnection structure which has a thermal diffusivity less than that of said second interconnection structure.

4. The device of claim 1 wherein said plurality of word line structures each has said electrical conductor therein providing electrical contact to said corresponding one of said bit structures through being against a second contact surface thereof substantially parallel to said intermediate layer major surfaces located on an opposite side of said intermediate layer therein from said first interconnection structure also providing electrical contact thereto.

5. The device of claim 4 further comprising said plurality of bit structures each having a relatively high thermal resistance material layer located between said first intermediate layer and said first interconnection structure which has a thermal diffusivity less than that of said first interconnection structure, and another relatively high thermal resistance material layer located between said second intermediate layer and said corresponding word line electrical conductor providing electrical contact thereto which has a thermal diffusivity less than that of that said corresponding word line electrical conductor.

6. The device of claim 4 further comprising said plurality of word line structures each having said electrical conductor therein providing electrical contact to said corresponding one of said bit structures has at least one side thereof cladded with a magnetically permeable material.

7. The device of claim 6 further comprising said magnetically permeable material extending from where cladding a said electrical conductor corresponding to one of said bit structures to being positioned across at least from opposite edges of said first and second intermediate layers in that said bit structure.

8. The device of claim 1 further comprising said plurality of bit structures each having a relatively high thermal resistance material layer located between said intermediate layer and said first interconnection structure which has a thermal diffusivity less than that of said first interconnection structure.

9. The device of claim 8 wherein said relatively high thermal resistance material layer also is antiferromagnetic.

10. The device of claim 1 wherein said information storage and retrieval circuitry has a plurality of transistors therein so that each of said plurality of bit structures has a said transistor electrically coupled thereto that selectively substantially prevents current in at least one direction along a current path through that said bit structure.

11. The device of claim 1 wherein that said one of said first and second intermediate layers formed of an electrically insulative nonmagnetic material has differing values of electrical resistance between said first and second major surfaces thereof at least at two differing locations across said first and second major surfaces.

* * * * *

UNITED STATES PATENT AND TRADEMARK OFFICE
CERTIFICATE OF CORRECTION

PATENT NO. : 7,230,844 B2  
APPLICATION NO. : 11/249046  
DATED : June 12, 2007  
INVENTOR(S) : James G. Deak Page 1 of 1

It is certified that error appears in the above-identified patent and that said Letters Patent is hereby corrected as shown below:

Column 2, Line 32, delete "maybe", insert --may be--

Signed and Sealed this

Twentieth Day of November, 2007

JON W. DUDAS  
*Director of the United States Patent and Trademark Office*

UNITED STATES PATENT AND TRADEMARK OFFICE
CERTIFICATE OF CORRECTION

PATENT NO. : 7,230,844 B2 Page 1 of 1
APPLICATION NO. : 11/249046
DATED : June 12, 2007
INVENTOR(S) : James G. Deak It is certified that error appears in the above-identified patent and that said Letters Patent is hereby corrected as shown below:

Column 1, Line 12, insert the following paragraph between Cross-Reference To Related Application paragraph and Background of the Invention:

--This invention was made with Government support under HDTRA1-04-C-0002 awarded by the Defense Threat Reduction Agency. The Government has certain rights in the invention.--

Signed and Sealed this

Second Day of September, 2008

JON W. DUDAS
*Director of the United States Patent and Trademark Office*